United States Patent
Kobayashi et al.

(10) Patent No.: US 6,434,065 B1
(45) Date of Patent: Aug. 13, 2002

(54) SEMICONDUCTOR MEMORY DEVICE OF LOW POWER CONSUMPTION

(75) Inventors: Shinichi Kobayashi; Masaki Tsukude, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/911,729

(22) Filed: Jul. 25, 2001

(30) Foreign Application Priority Data

Jan. 10, 2001 (JP) ........................................ 2001-002585

(51) Int. Cl.$^7$ ................................................ G11C 7/00
(52) U.S. Cl. .................... 365/200; 365/203; 365/189.11
(58) Field of Search ................................. 365/200, 203, 365/189.11, 225.7

(56) References Cited

U.S. PATENT DOCUMENTS

| | | | |
|---|---|---|---|
| 5,253,205 A | * | 10/1993 | Eaton, Jr. .............. 365/189.06 |
| 5,666,315 A | | 9/1997 | Tsukude et al. |
| 5,673,231 A | * | 9/1997 | Furutani ..................... 365/203 |
| 6,064,602 A | * | 5/2000 | Liu ........................ 365/189.06 |

* cited by examiner

Primary Examiner—Vu A. Le
(74) Attorney, Agent, or Firm—McDermott, Will & Emery

(57) ABSTRACT

In order to change the precharging voltage level when the bit lines are in the floating state, current control circuits are provided for restricting a current supply amount to the bit lines in the standby state, for example. Data, of which the logic level is fixed, are read out, in the existence of a leak current, due to a change of the bit line voltage caused by this leak current and thereby, the existence of a minute leak current can be detected. Consequently, a semiconductor memory device with an extremely low standby current is implemented by precisely detecting a minute leak current of the bit lines and by repairing the leak current defect.

12 Claims, 15 Drawing Sheets

US 6,434,065 B1

SEMICONDUCTOR MEMORY DEVICE OF LOW POWER CONSUMPTION

BACKGROUND OF THE INVENTION

1. Field of the Invention

The present invention relates to a semiconductor memory device, and in particular, to a configuration for reducing the current consumption in a standby state. The invention relates, more particularly, to a configuration for detecting, down to a minute current level, a leak current caused by a micro short circuit between a word line (row line) and a bit line, or the like, (column line) so as to repair this micro current path.

2. Description of the Background Art

FIG. 22 is a diagram schematically showing the configuration of an array part of a conventional semiconductor memory device. In FIG. 22, the configuration of a part related to bit lines of a dynamic random access memory (DRAM) requiring a refreshing operation that data is periodically restored.

In FIG. 22, memory cells MC are arranged in rows and columns. Corresponding to respective columns of the memory cells MC, bit line (column line) pairs BL0, /BL0 to BLn, /BLn are arranged. These bit line pairs BL0, /BL0 to BLn, /BLn are provided with bit line related circuits BK0 to BKn, respectively, and the configuration of the bit line related circuit BK0 corresponding to the bit line pair BL0 and /BL0 is specifically shown in FIG. 21.

The bit line related circuit BK0 includes a memory cell MCa provided corresponding to a crossing between the bit line BL0 and the word line WL0, a memory cell MCb arranged corresponding to a crossing between the bit line /BL0 and the word line WL1, a bit line isolation gate 3 responsive to a bit line isolation instructing signal BIL for isolating the bit lines BL0 and /BL0 from common bit lines CBL0 and /CBL0, a sense amplifier 2 responsive to activation of sense amplifier driving signals SP and SN, for amplifying the difference of voltages between the common bit lines CBL0 and /CBL0 and a bit line precharging/equalizing circuit 1 activated upon activation of a bit line precharging/equalizing instructing signal BLEQ for precharging and equalizing the bit lines BL0 and /BL0 to a predetermined precharge voltage PBL0 level via the common bit lines CBL0 and /CBL0.

The same configuration is provided in the remaining bit line related circuits BKm to BKn.

The memory cells arranged in alignment in one row are connected to each of the word lines WL0 and WL1.

The bit line isolation instructing signal BIL is applied in common to bit line isolation gates 3 included in these bit line related circuits BK0 to BKn. In the same manner, the sense amplifier driving signals SP and SN are applied in common to sense amplifiers 2 included in these bit line related circuits BK0 to BKn.

The bit line precharging/equalizing instructing signal BLEQ is applied in common to the bit line precharging/equalizing circuits 1 included in these bit line related circuits BK0 to BKn. The bit line precharging/equalizing circuits 1 are divided into a plurality of groups. In FIG. 22, the bit line precharging/equalizing circuits 1 included in the bit line related circuits BK0 to BKm, form one group and the bit line precharging/equalizing circuits 1 included in the bit line related circuits BKm+1 to BKn form another group.

The bit line precharging/equalizing circuits 1 included in the bit line related circuits BK0 to BKm are connected to a local intermediate voltage transmission line 6a, and the bit line precharging/equalizing circuits included in the bit line related circuits BKm+1 to BKn are connected to a local intermediate voltage transmission line 6b. The local intermediate voltage transmission lines 6a and 6b are linked to the main intermediate voltage transmission line 5 via fusible link elements (fuse elements) 4a and 4b, respectively.

The memory cells MCa and MCb each include a capacitor QS for storing information and an access transistor (N channel MOS transistor) MT responsive to a signal potential on the corresponding word line WL (WL0, WL1) for connecting the capacitor QS to the corresponding bit line BL (BL0, /BL0).

The bit line isolation gates 3 each include a pair of transfer gates responsive to the bit line isolation instructing signals BIL for connecting the bit lines BL0 and /BL0 to the common bit lines CBL0 and /CBL0, respectively. These bit line isolation gates 3 are provided because this DRAM has a shared sense amplifier configuration so that the sense amplifier 2 is shared between the adjacent bit line pairs, which are not shown. Upon reading out of data of the memory cells, the memory array, which includes a selected memory cell, is connected to the sense amplifiers 2, while the non-selected memory array (memory array where no selected memory cells is present) is isolated from the corresponding sense amplifiers 2 by means of the corresponding bit line isolation gate.

The sense amplifier 2 includes a P sense amplifier responsive to activation of the sense amplifier driving signal SP for driving a common bit line of higher potential out of the common bit lines CBL0 and /CBL0 to the H level (logical high level) and an N sense amplifier for driving a common bit line of lower potential out of the common bit lines CBL0 and /CBL0 to the L level upon activation of the sense amplifier driving signal SN.

The P sense amplifier includes P channel MOS transistors P1 and P2, having their gates and drains cross-coupled, while the N sense amplifier includes N channel MOS transistors N1 and N2 having their gates and drains cross-coupled. The sense amplifier driving signal SP is applied to the sources of these P channel MOS transistors P1 and P2, while the sense amplifier driving signal SN is applied to the sources of the N channel MOS transistors N1 and N2.

The bit line precharging/equalizing circuit 1 includes N channel MOS transistors N3 to N5 responsive to activation of the bit line precharging/equalizing signal BLEQ to become conductive. When rendered conductive, the N channel MOS transistor N3 electrically short circuits the common bit lines CBL0 and /CBL0. When rendered conductive, the N channel MOS transistors N4 and N5 transmit the intermediate voltage VBL, which is transmitted onto the local intermediate voltage transmission line 6a to the common bit lines CBL0 and /CBL0, respectively. This intermediate voltage VBL is normally a voltage level of ½ times the voltages corresponding to the H level and to the L level of the data stored in memory cells.

In the standby state, the bit line isolation instruction signal BIL is at the H level (normally a voltage level higher than the power supply voltage) and the bit line isolation gates 3 in the bit line related circuits BK0 to BKn are all in the conductive state. In the standby state, the bit line precharging/equalizing instruction signal BLEQ is also at the H level and the MOS transistors N3 to N5 in the bit line precharging/equalizing circuits 1 are all in the ON state, and the bit lines BL0, /BL0 to BLn /BLn are all precharged and equalized to the intermediate voltage VBL level. The word lines WL0 and WL1 are in the non-selected state at the L level, and the access transistors in the memory cells MCa and MCb are in the non-conductive state.

In the memory cell selection operation, first, the bit line precharging/equalizing instruction signal BLEQ becomes the L level, and in the bit line related circuits BK0 to BKn, the bit line precharging/equalizing circuits 1 transition into the non-activate state, and the bit lines BL0, /BL0 to BLn, /BLn transition into the floating state at this intermediate voltage VBL level.

Then, an addressed row is driven to the selected state and data of the memory cells connected to this selected word line are transmitted to the corresponding bit lines. In the case where the word line WL0 is selected, the voltage level of this word line WL0 attains the H level and the access transistor MT in the memory cell MCa transitions into the ON state so that the charge held by the memory cell capacitor QS is transmitted to the corresponding bit line BL0. The word line WL1 is in the non-selected state and no memory cell data are transmitted to the bit line /BL0, and the bit line /BL0 maintains the level of the intermediate voltage VBL.

In the selection of the word line WL0, the bit line isolation instruction signal BIL is at the H level and the bit line isolation gates 3 are in the ON state so that the bit lines BL0, /BL0 to BLn, /BLn are connected to the corresponding common bit lines CBL0, /CBL0 to CBLn, /CBLn, respectively. On the other hand, the bit line isolation gates provided for a not shown memory array (memory array which shares the sense amplifier 2) are turned into the OFF state so that this non-selected memory array is isolated from the sense amplifiers 2.

When the memory cell data is transmitted to the common bit lines CBL0, /CBL0 and the voltage difference becomes large, the sense amplifier driving signals SP and SN are driven to the H level and to the L level, respectively, at a predetermined timing, and the sense amplifier 2 carries out the sensing operation. Due to the sensing operation of this sense amplifier 2, the voltage levels of the common bit lines CBL0 and /CBL0 are set at the H level and the L level in accordance with the memory data of the memory cell MCa.

The voltages of these common bit lines CBL0, /CBL0 are also transmitted to the bit lines BL0, /BL0, and the rewriting (restoring) of the data to the memory cell MCa is performed.

Thereafter, a column selection operation is performed in accordance with a column selection instruction from an outside so that a not shown column selection gate provided corresponding to a selected column become conductive, and the writing in or the reading out of the data are performed for the selected memory cell on the selected column.

FIG. 23 is a diagram schematically showing the configuration of a bit line related circuit BK. Here, the case where a micro short circuit ZR exists between the word line WL and the bit line BL as shown in FIG. 23 is considered. The possibility of occurrence of such a micro short circuit ZR becomes higher when the miniaturization of the DRAM progresses to shorten the distance between the word line WL and the bit lines BL, /BL extremely because of the following reasons. Normally, the word line WL is connected to the gate of the access transistor MT, while the bit line BL is connected to the source/drain node of the access transistor MT. Along with the miniaturization of the access transistor, the distance between the word line and the bit lines BL, /BL becomes smaller so that short circuiting is more likely to occur because of the mixing in of contamination, or the like. In addition, because of the effect of a gap in an interlayer insulating film, a path for a short-circuit current tends to be easily formed between the word line and the bit line.

In the case where such a micro short circuit ZR occurs, a leak current constantly flows via this micro short circuit ZR.

In the standby state, the bit line precharging/equalizing circuit 1 is in the activate state, to transmit the intermediate voltage VBL to the bit lines BL and /BL. Now, the case is considered where a current supplied by the bit line precharging/equalizing circuit 1 is larger than the leak current I1s flowing through the micro short circuit ZR, and the voltage level of the bit lines BL and /BL is maintained at approximately the intermediate voltage VBL level in the standby state.

Now, the state as shown in FIG. 24 is considered where the word line WL is driven to the selected state when the L level data is maintained in the memory cell MC. The row selection operation is started in accordance with the array activation signal ACT. First, the bit line precharging/equalizing circuit 1 is deactivated and then, the word line WL is driven to the selected state. The L level data is transmitted to the bit line BL from the memory cell MC while the word line WL is driven to the H level and therefore, a leak current from the word line WL in the selected state flows to the bit line BL in the floating state, so that the voltage level of this bit line BL increases and the absolute value of the reading out voltage of the L level of the bit line BL becomes small. Accordingly, in the sensing operation, a sufficient voltage difference cannot be provided to the bit lines BL and /BL, which causes a sense margin defect, and therefore, a precise sensing operation cannot be performed.

In addition, in the case that the voltage level of the bit line BL rises to exceed the precharged voltage level due to the leak current from the selected word line via the micro short circuit in this short circuit state, the L level data may be sensed as the H level data depending on this voltage level, resulting in an incorrect sensing of the data.

Further, in the case, as shown in FIG. 25, that the word line WL is in the non-selected state and another word line WL is selected and the memory cell connected to the bit line BL stores the H level data, the H level data transmitted to this bit line BL are discharged via the micro short circuit ZR so that the voltage level of this bit line BL is lowered. In the same manner, a sensing margin defect occurs and therefore, a precise sensing operation cannot be performed. Such a defective bit line is replaced with a spare bit line pair, which is not shown, so that a repair of this defective bit line is performed.

However, since this defective bit line exists within the memory array, the leak current I1s flows constantly via this micro short circuit ZR in the standby state, to increase the standby current. In order to prevent the increase of standby current caused by such a leak current of the micro short circuit, the bit line pairs are divided into groups so that the link elements 4a and 4b are selectively blown off on a group unit. In the case that a defective bit line exists in each group, the corresponding link element 4 (4a or 4b) is blown off so that the local intermediate voltage transmission line 6 (6a or 6b) is isolated from the main intermediate voltage transmission line 5. Thereby, the current consumption in the standby state is reduced.

The case where a bit line defect is detected and the defect is repaired through a redundancy replacement by means of such link elements 4a and 4b, is limited to the case where the resistance value of the micro short circuit ZR is comparatively small. A function test is performed that the writing in/reading out of test data is performed for a memory cell, and a defect can be detected when the reading out of incorrect data occurs. The configuration intended to prevent the increase of the standby current due to such a defect of bit line short circuit is disclosed in, for example, U.S. Pat. No. 5,666,315.

As described above, it is necessary to carry out a function test of a memory cell so as to determine whether or not the writing in/reading out of data is performed precisely in order to detect a defect caused by such a micro short circuit ZR. Accordingly, in the case that the resistance value of this micro short circuit ZR is sufficiently large and the level of the current of the leak current Ils is so small as not to greatly influence the reading out voltage of bit lines, the defect cannot be detected during the function test and therefore, the micro short circuit (bit line short circuit) ZR of such a high resistance cannot be repaired.

In the case that such micro short circuits exist in a large number, the total standby leak current cannot be ignored.

In addition, in a battery driven application, such as in portable equipment, an extremely small standby current value is required, from the viewpoint of battery life, as a specification value of the standby current. Accordingly, the problem arises that, though normal operation is ensured even when a micro short circuit exists, the specification value of the ultra low standby current in the order of microampere ($\mu$A) cannot be satisfied.

Such a problem is not limited to the micro short circuit between a bit line and a word line, and the same problem arises in the case that a micro short circuit exists between a bit line and a ground line.

SUMMARY OF THE INVENTION

An object of the present invention is to provide a semiconductor memory device allowing detection of a bit line leak current with a high precision so that a bit line defect is repaired.

Another object of the present invention is to provide a semiconductor memory device allowing the standby current to be greatly reduced.

A semiconductor memory device according to one aspect of the present invention includes: a plurality of memory cells arranged in rows and columns; a plurality of column lines arranged corresponding to respective columns, each connected to memory cells aligned on a corresponding column; a plurality of column line potential maintaining circuits provided corresponding to the plurality of column lines for maintaining the corresponding column lines at a predetermined potential when activated; a voltage transmission line for supplying the predetermined voltage to these column line potential maintaining circuits; a current control circuit for controlling a current flowing between the voltage transmission line and the column line maintaining circuits; and isolation circuits for isolating the corresponding column line potential maintaining circuits from said voltage transmission line. These isolation circuits are provided for every predetermined number of the column line potential maintaining circuits.

A semiconductor memory device according to another aspect of the present invention includes: a plurality of memory cells arranged in rows and columns; a plurality of column lines arranged corresponding to respective columns, each connected to memory cells aligned on a corresponding column; a plurality of row lines arranged corresponding to respective rows, each is connected to memory cells aligned on a corresponding row; a plurality of column line potential maintaining circuits which are coupled to the column lines, respectively, for maintaining corresponding column lines at a predetermined potential when made active; a row related circuit for deactivating the column line potential maintaining circuits and for driving a row line corresponding to an addressed row into a selected state in response to a memory cell selection instruction; and a test mode circuit for changing the time until the deactivation of the column line potential maintaining circuit and the row line selection by means of the row related circuit in response to a test mode instruction signal.

A semiconductor memory device according to a further aspect of the present invention includes: a plurality of memory cells arranged in rows and columns; a plurality of row lines arranged corresponding to respective rows, each connected to memory cells aligned on a corresponding row; a plurality of column lines arranged corresponding to respective columns, each connected to memory cells aligned on a corresponding column; column line potential maintaining circuits arranged corresponding to the plurality of these column lines for maintaining the corresponding column lines at a predetermined potential level when activated; a column line potential setting circuit for setting the holding potential of these column line potential maintaining circuits at a first potential level which is different from the predetermined potential in the test mode; a row line potential setting circuit for setting a predetermined number of row lines at a second potential which is different from said first potential in the test mode; and a circuit for reading out data of a selected memory cell.

By making the supply current of the column line potential maintenance circuit limitable, the potential of a column line can be changed by means of a leak current caused by a high resistance short circuit even when the high resistance short circuit, such as a micro short circuit, exists in the column line and thereby, a column line defect can be detected correctly. By isolating the column line potential maintenance circuit of the defective column line from the voltage transmission line, by means of an isolation circuit, a leak current in the standby state can be reduced.

In addition, by delaying the start of row line selection after transition into the memory cell selection cycle, the change of the potential of a column line can be made large by means of a leak current through the current leak path of this column line, and a column line defect can be detected correctly.

Further, by forcing a plurality of row lines into the selected state after once driving the column line into the first potential which is different from the potential of the selected row, in the case that a short circuit exists between a row line and a column line, the potential of this column line can be greatly changed so that the column line defect can be detected correctly.

In the detection of these column line defects, the current consumption in the standby state can be reduced by isolating a defective column from the voltage supply source.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
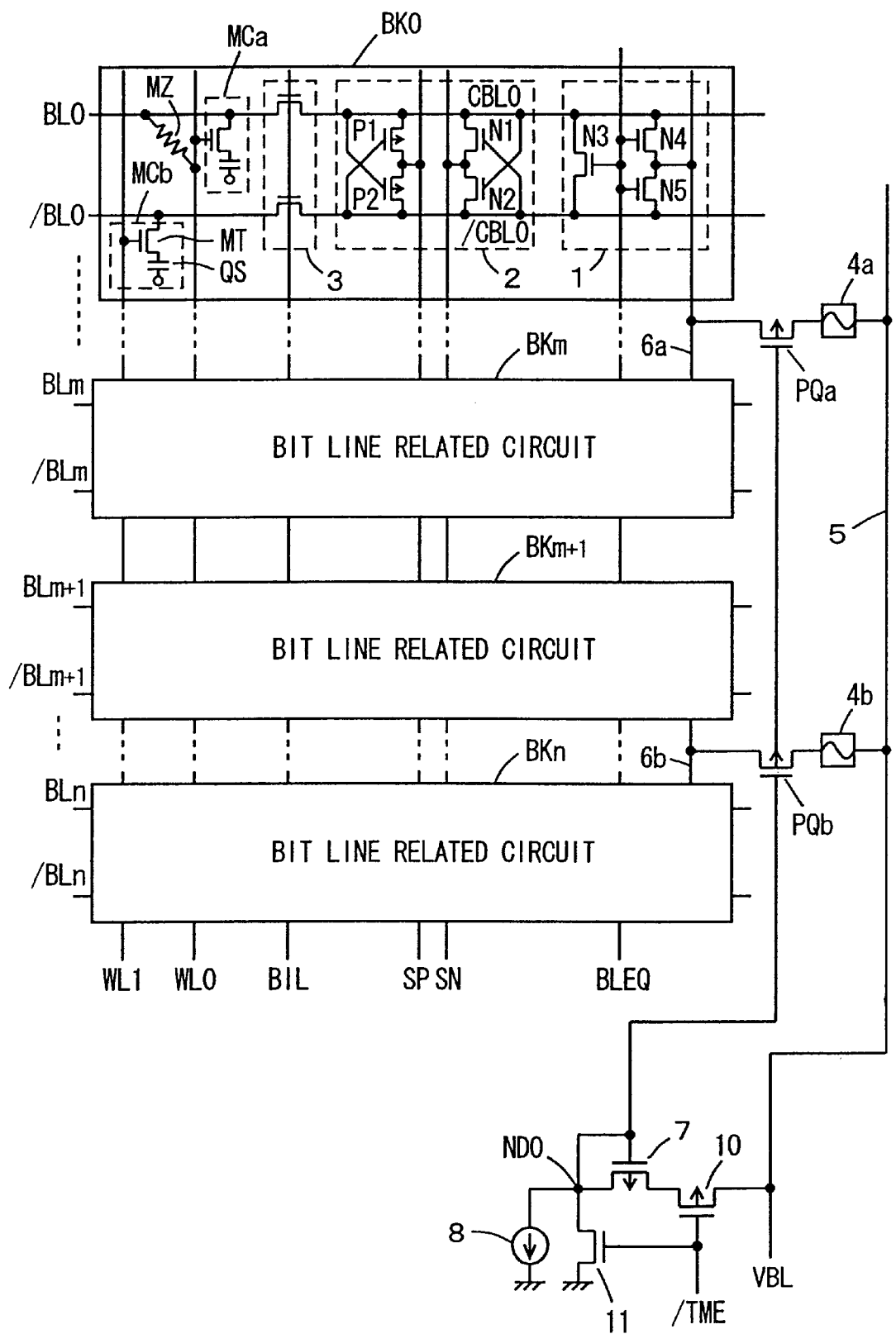
FIG. 1 is a diagram showing the configuration of a main part of a semiconductor memory device according to a first embodiment of the present invention.

FIG. 1 is a diagram showing the configuration of a main part of a semiconductor memory device according to the first embodiment of the present invention. In the configuration shown in this FIG. 1, a P channel MOS transistor PQa is connected between a local intermediate voltage transmission line 6a and a link element 4a and a P channel MOS transistor PQb is connected between a local intermediate voltage transmission line 6b and a link element 4b.

In order to control a supply current of these MOS transistors PQa and PQb, a constant current generation circuit is provided. The constant current generation circuit includes: P channel MOS transistors 7 and 10, that are connected in series between the main intermediate voltage transmission line 5 and a node ND0; a constant current source 8 coupled to the node ND0; and an N channel MOS transistor 11 couples the node ND0 to a ground node in deactivation of a test mode instruction signal /TME.

The P channel MOS transistor 10 receives, on its gate, the test mode instruction signal /TME and is turned into the OFF state in activation(the L level) of the test mode instruction signal /TME to couple the MOS transistor 7 to the main intermediate voltage transmission line 5.

The MOS transistor 7 forms a current mirror circuit with the MOS transistors PQa and PQb to generate a mirror current of the current discharged from the constant current source 8 through the MOS transistors PQa and PQb.

The MOS transistor 11 becomes conductive in deactivation of the test mode instruction signal /TME, to couple the node ND0 to the ground node to short circuit the constant current source 8.

The constant current source 8 having the supply current variable determines the current discharged through a micro short circuit.

Figure 21:
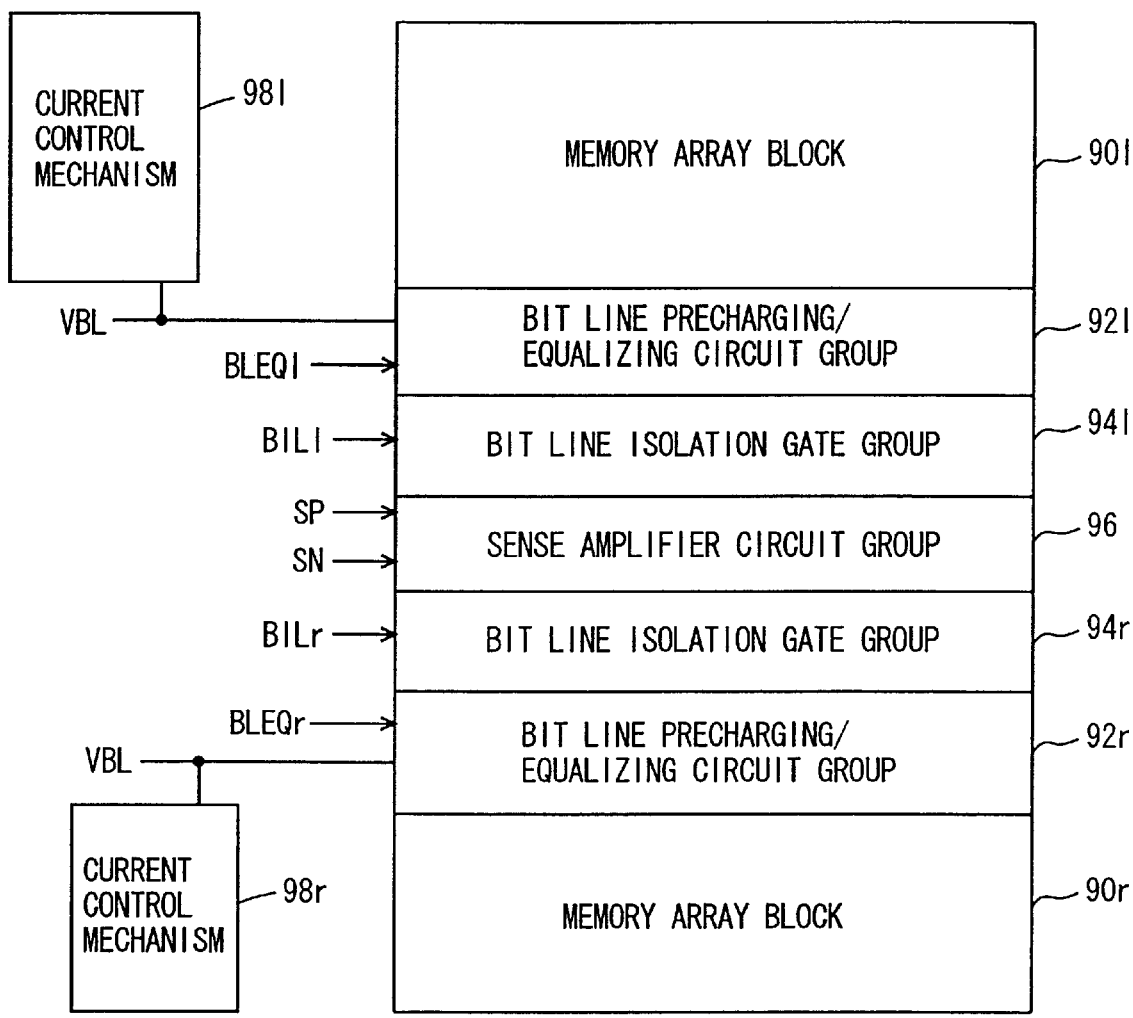
FIG. 21 is a diagram showing the configuration of a main part of a semiconductor memory device according to a fifth embodiment of the present invention.
Figure 22:
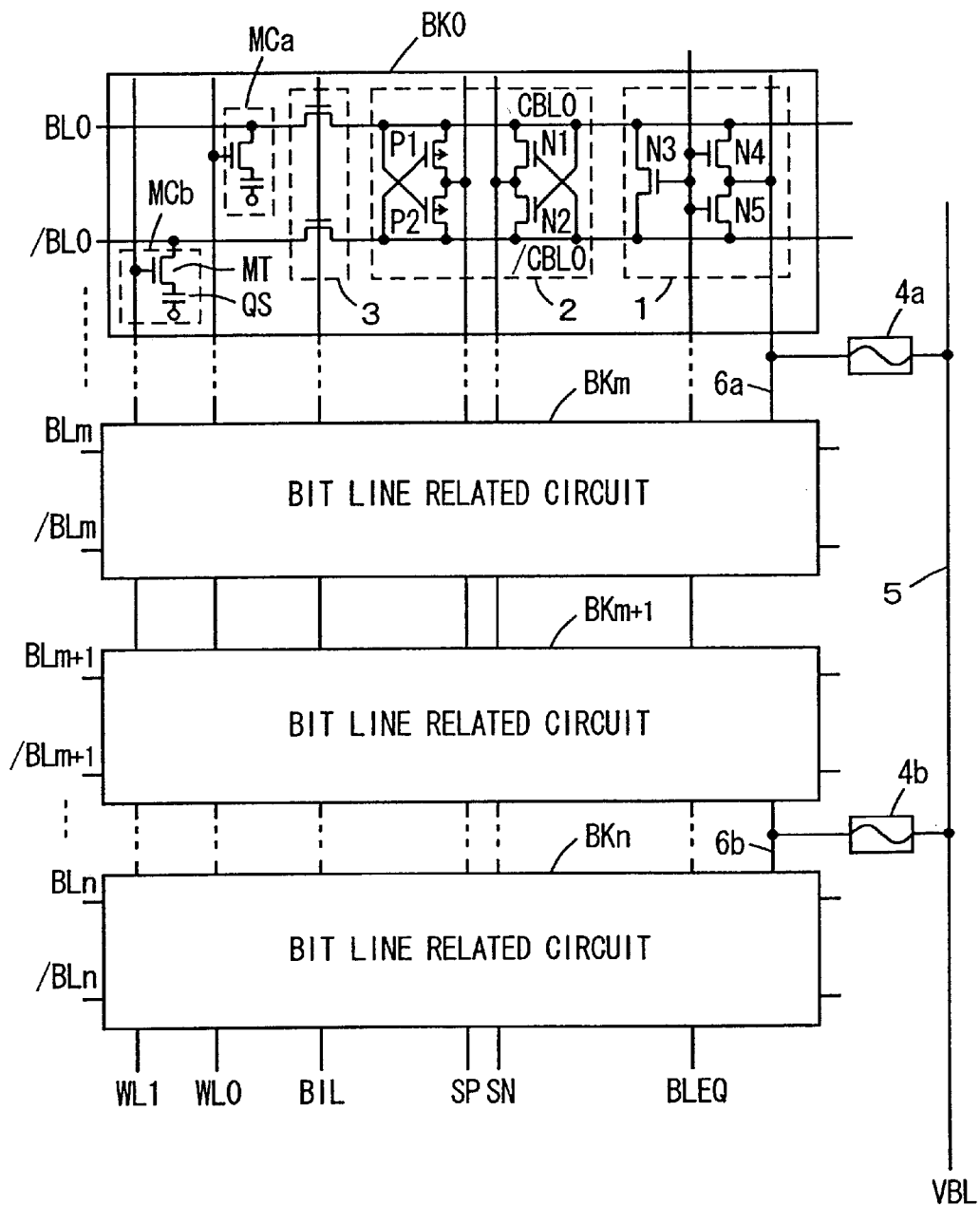
FIG. 22 is a diagram schematically showing the configuration of an array part of a conventional semiconductor memory device.
Figure 23:
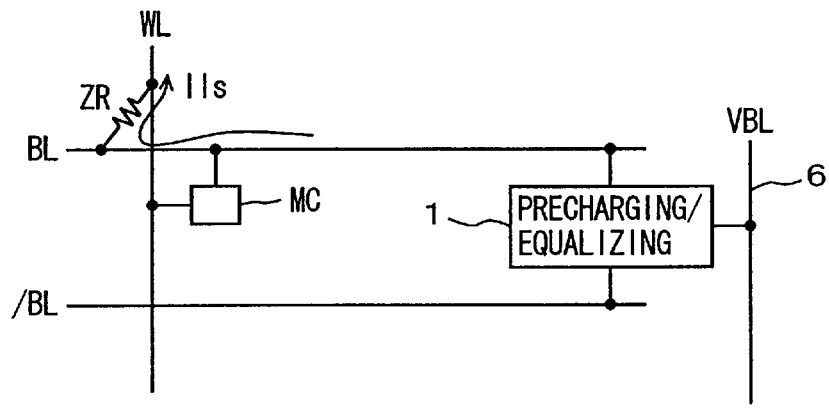
FIG. 23 is a diagram showing an example of a micro short circuit in a semiconductor memory device.
Figure 24:
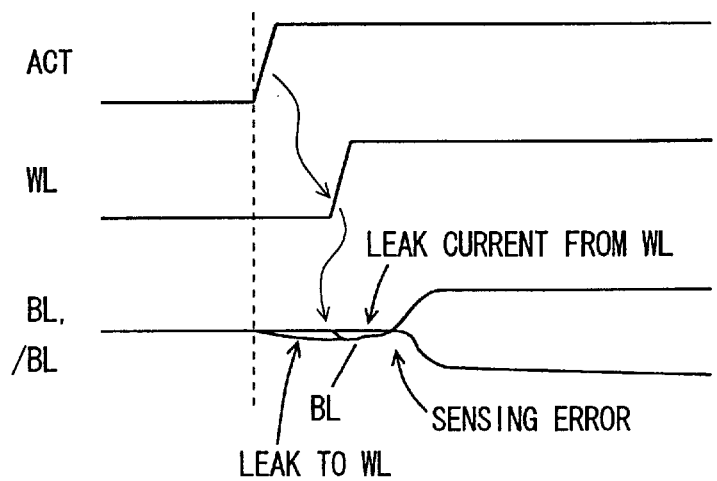
FIG. 24 is a diagram representing the effects of the micro short circuit shown in FIG. 23.
Figure 25:
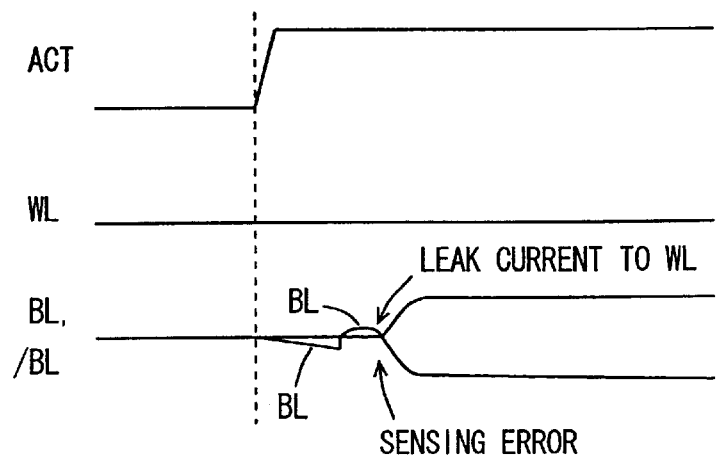
FIG. 25 is a diagram representing the effect of the micro short circuit shown in FIG. 23 on the memory cell reading out data.

The MOS transistors PQa and PQb are connected to the node ND0 at their respective gates. The other parts of the configuration are the same as those of the configuration of the conventional semiconductor memory device as shown in FIG. 21 and the corresponding parts are denoted by the same reference numerals, and the detailed descriptions thereof are omitted. Now, the operation of the semiconductor memory device, shown in FIG. will be described with reference to the signal waveform diagram shown in FIG. 2.

In the memory cell selection cycle wherein the memory cell selection operation is performed, the array activation signal ACT is in the activate state of the H level, and the word line driving timing signal WLX is in the activate state of the H level. This word line driving timing signal WLX is transmitted to an addressed word line WL. The bit lines BL and /BL are driven to the H level and the L level in accordance with the selected memory cell data.

After completion of the memory cell selection cycle, array activation signal ACT is deactivated, the word line driving timing signal WLX attains H level and the selected word line WL is turned into the non-selected state.

The bit line precharging equalizing circuit 1 is activated in response to deactivation of the array activation signal ACT (bit line precharging/equalizing instruction signal BLEQ is activated). Responsively, the voltage level of the bit lines BL and /BL, which have been maintained at the H level and the L level by the sense amplifier 2, is once driven to the voltage level of the intermediate voltage Vcc/2.

In the case that the driving current of the constant current source 8 is made small, a current amount supplied to each of the local intermediate voltage transmission lines 6a and 6b become correspondingly small. Here, the case, as shown in FIG. 1, is considered where a micro short circuit MZ is present between the bit line BL0 and the word line WL0. This micro short circuit MZ couples the bit line BL0 to the word line WL0. In the standby state, the word line WL0 is at the L level (normally ground voltage level) and a current supplied from this bit line precharging/equalizing circuit 1 to the bit line BL0 is discharged to the word line WL0 at the L level via the micro short circuit MZ. At this time, the supply current of the bit line precharging/equalizing circuit 1 is made sufficiently small by the constant current source 8 and therefore, the voltage level of the bit line BL0 is lowered. The voltage level of the complementary bit line /BL0 is also lowered correspondingly by means of the bit line precharging/equalizing circuit 1. Accordingly, even in the case that the resistance value of this micro short circuit MZ between the bit line and the word line is sufficiently high, this micro short circuit MZ can sufficiently lower the level of the bit line precharging/equalizing voltage.

When the next memory cell selection cycle starts, the array activation signal ACT is activated and responsively, the bit line precharging/equalizing signal BLEQ attains the L level so that the bit line precharging/equalizing circuit 1 is deactivated. In this state, the bit lines BL and /BL (BL0, /BL0) are maintained at the level of the precharged voltage. The bit line BL0 is connected to the word line WL0 via the micro short circuit MZ. However, since the resistance value of this micro short circuit MZ is sufficiently high, the amount of potential lowering of the bit line BL (BL0) is small in this state. The other bit line /BL is in the floating state to maintain the level of precharged voltage since no micro short circuit exists.

Figure 2:
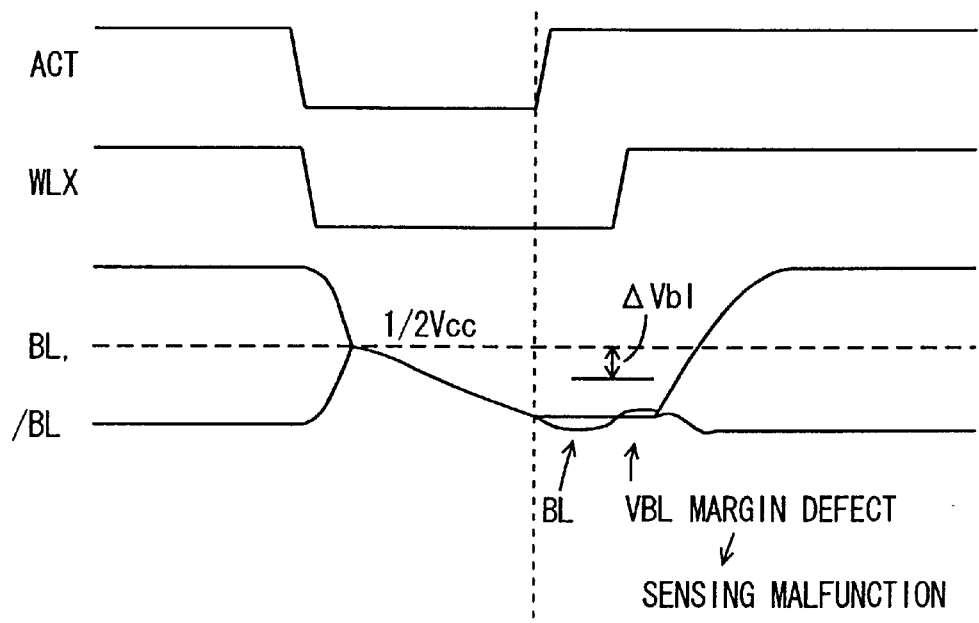
FIG. 2 is a signal waveform diagram representing the operation of the semiconductor memory device shown in FIG. 1.

In accordance with the activation of this array activation signal ACT, the word line driving signal WLX is again driven to the H level so that the data of the memory cell connected to the addressed word line is transmitted to the corresponding bit line BL or /BL. Then, the sense amplifier driving signals SP and SN are activated. However, the voltage level of the bit lines BL and /BL (common bit lines CBL0 and /CBL0) is lower than the voltage level of the intermediate voltage Vcc/2 even when the H level data is read out from the bit line BL, as shown in FIG. 2, and is also lower than the voltage allowed for the intermediate voltage VBL. Thus, the VBL margin $\Delta$ Vbl required for precharged voltage VBL in order to carry out a precise sensing operation is substantially absent.

In this case, in the sense amplifier 2, even when the sense amplifier driving signal SN is driven to the ground voltage level, the voltage level of the common bit lines CBL and /CBL (CBL0 and /CBL0) is approximately at the same level of the threshold voltage of the N channel MOS transistors N1 and N2, or less. Accordingly, the N sense amplifier is not activated or carries out an incorrect sensing operation. Thus, even when the sense amplifier driving signal SP is subsequently activated, the P sense amplifier (MOS transistors P1 and P2) cannot carry out a precise restoring operation. Consequently, an incorrect sensing operation is performed and a bit line defect (bit line short circuit) of a minute leak current can be detected by carrying out the function testing.

The lowering of the bit line precharging voltage caused by this micro short circuit MZ occurs commonly in the bit lines BL0 and /BL0 by means of the bit line precharging/equalizing circuit 1. At this time, a bit line precharging current is supplied commonly to the bit line related circuits BK0 to BKm by the MOS transistor PQa and therefore, an incorrect sensing operation is performed on these bit lines BL0, /BL0 to BLm, /BLm.

Accordingly, by observing coincidence/non-coincidence of the logic level between the read-out data and written-in data by carrying out the writing in/reading out of the data to/from the memory cells, the presence of the micro short circuit MZ of high resistance can be detected.

After completing this test, the local intermediate voltage transmission line 6a is disconnected from the main intermediate voltage transmission line 5 by blowing off the link element 4a at the laser trimming step which is the final step at the wafer level. Thus, no current supply source exists for this micro short circuit MZ and a current consumption during standby can be reduced.

Here, a group of pairs of bit lines BL0, /BL0 to BLm, /BLm is replaced with spare bit line pairs which are not shown.

As described above, in the case that an amount of the leak current of the micro short circuit MZ is extremely small, the minute leak current can be detected by adjusting the amount of driving current of the constant current source 8. Consequently, the micro short circuit defect is repaired and therefore, a semiconductor memory device with an extremely low standby current can be implemented.

Here, in the test mode, the test mode instruction signal /TME is in the activate state of the L level and the MOS transistors 7 and 10 sink a current from the main intermediate voltage transmission line 5 to the constant current source 8. In this test mode, the MOS transistor 11 is in the OFF state and the discharging operation of the node ND0 by the constant current source 8 is not influenced. Therefore, a mirror current corresponding to the driving current, which is set by the constant current source 8, precisely occurs in the MOS transistors PQa and PQb.

On the other hand, in the normal operation mode other than the mode where the bit line precharging current is controlled, the test mode instruction signal /TME is in the deactivate state of the H level, and the MOS transistor 10 is in the OFF state while the MOS transistor 11 is in the ON state. Accordingly, the node ND0 is kept at a ground voltage level and responsively the voltage level of the gates of the MOS transistors PQa and PQb becomes L level of the ground voltage level, and these MOS transistors PQa and PQb transmit currents, corresponding to respective sizes (ratios of the channel widths to the channel lengths), to the corresponding local intermediate voltage transmission lines 6a and 6b (here, in the case that the corresponding link element is in the non-blown state). In this state, the constant current source 8 is connected between nodes of the ground voltage level, and is deactivated.

Figure 3:
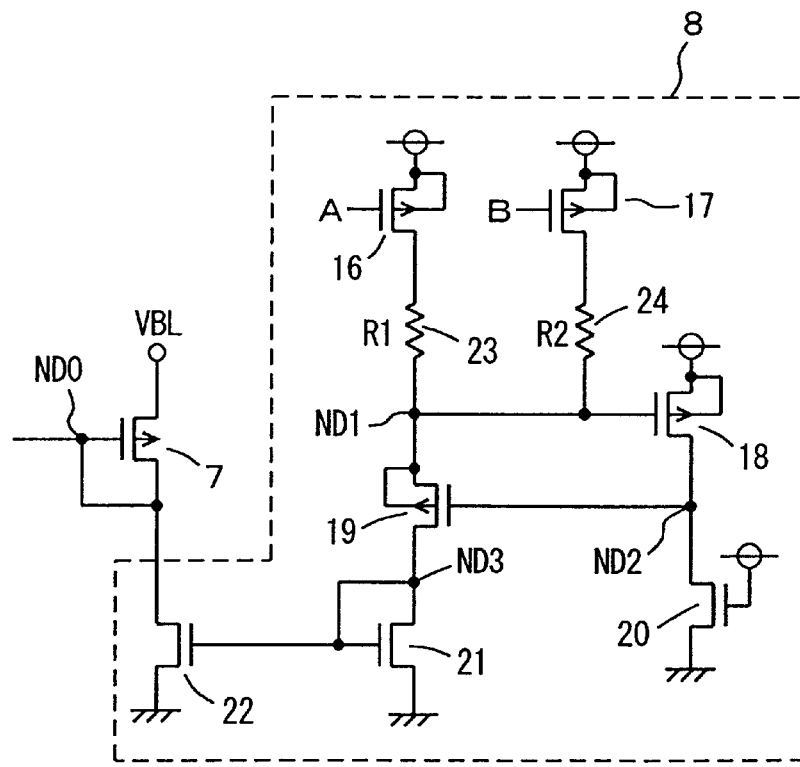
FIG. 3 is a diagram showing an example of the configuration of the constant current source shown in FIG. 1.

FIG. 3 is a diagram showing an example of a configuration of the constant current source 8 shown in FIG. 1. In FIG. 3, the constant current source 8 includes a P channel MOS transistor 16 and a resistance element 23 that are connected in series between the power source node and the node ND1 as well as a P channel MOS transistor 17 and a resistance element 24 that are connected in series between the power source node and the node ND1 in parallel to the connection of the transistor 16 and the resistance element 23. Current amount adjustment signals A and B are applied to the gates of the MOS transistors 16 and 17, respectively. The back gates of these MOS transistors 16 and 17 are connected to the power source node. The resistance elements 23 and 24 have the resistance values R1 and R2, respectively.

The constant current source 8 further includes a P channel MOS transistor 18 connected between the power source node and the node ND2 and having the gate connected to the node ND1, a P channel MOS transistor 19 connected between the node ND1 and the node ND3 and having the gate connected to the node ND2, an N channel MOS transistor 20 connected between the node ND2 and the ground node and having the gate connected to the power source node, an N channel MOS transistor 21 connected between the node ND3 and the ground node and having the gate connected to the node ND3, and an N channel MOS transistor 22 connected between the MOS transistor 7 and the ground node and having the gate connected to the node ND3.

The MOS transistors 21 and 22 form a current mirror circuit, and a mirror current of the current, flowing via this MOS transistor 21, flows through the MOS transistors 22 and 7.

The MOS transistor 20 is made to have an equivalent channel resistance thereof be sufficiently larger than the equivalent channel resistance of the MOS transistor 18 (the amount of the driving current of the MOS transistor 20 is made sufficiently smaller than the amount of the driving current of the MOS transistor 18).

In this case, in the MOS transistor 18, the voltage between the source and the gate becomes equal to the absolute value Vthp of the threshold voltage thereof. The MOS transistor 19 adjusts the amount of current flowing from the node ND1 to the node ND3 in accordance with the potential of the node ND2 to adjust the voltage level of the node ND1, and accordingly maintains the current flowing via these MOS transistors 18 and 19 at a constant level.

Here, in the case that the current adjustment signals A and B are both set at the H level, the MOS transistors 16 and 17 are both in the ON state so that the resistance element 23 and 24 are both connected to the power source node. In this case, the resistance elements 23 and 24 are connected in parallel between the node ND1 and the power source node so that the resistance value between the node ND1 and the power source node assumes R1//R2. Here, R1//R2 indicates a combined resistance of the resistance elements 23 and 24. Accordingly, the current flowing via this MOS transistor 19 becomes Vthp/(R1//R2).

In the case that the current amount adjustment signal A is set at the H level, while the current amount adjustment signal B is set at the H level, the resistance element 23 is linked to the power source node so that a current of Vthp/R1 flows through the MOS transistor 19. In the case that the current amount adjustment signal A is set at the H level, while the current amount adjustment signal B is set at the L level, a current of Vthp/R2 flows through the MOS transistor 19.

The constant current, which flows via this MOS transistor 19, flows through the MOS transistor 21. The mirror current of this constant current flows via the MOS transistors 22 and 7 so that the amount of the driving current of this constant current source 8 can be adjusted by the voltage level of the current amount adjustment signals A and B. The amount of the current driven by this constant current source 8 determines the detection level of the bit line leak current.

Accordingly, the amount of current of this constant current source is set for each chip and the detection leak current level can be set in accordance with the performance of the chip, and a product selection in accordance with the difference in the specification values of the standby current can be achieved.

Here, in this constant current source 8, such a configuration may be used wherein the resistance elements 23 and 24 are connected in series and the MOS transistors 16 and 17 are connected in parallel to these resistance elements 23 and 24, respectively. In this configuration, the resistance elements 23 and 24 can be selectively set in the short circuited state in accordance with the current amount adjustment signals A and B, so that the amount of the driving current of this constant current source 8 can be changed in the same manner.

For example, in the case that the resistance elements 23 and 24 are connected in series between the power source node and the node ND1, a current of Vthp/(R1+R2) flows through the MOS transistors 19 and 21.

Figure 4:
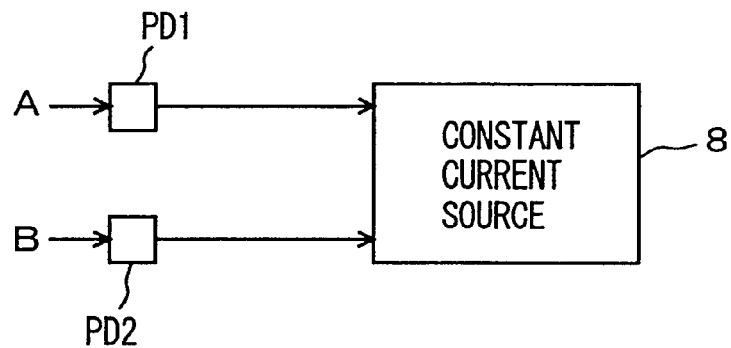
FIG. 4 is a diagram schematically showing a configuration of a control signal generation part shown in FIG. 3.

FIG. 4 is a diagram schematically showing the configuration of a part for generating the current amount adjustment signals. In FIG. 4, the current amount adjustment signals A and B from a tester (measuring apparatus) provided outside are applied to the pads PD1 and PD2. These pads PD1 and PD2 are coupled to the constant current source 8. Since the leak current detection test is performed before blowing off the link elements 4a and 4b shown in FIG. 1, the test is performed at the wafer level. Accordingly, in the case that appropriate unused pads exist, these unused pads can be utilized as the pads PD1 and PD2 for supplying the current amount adjustment signals A and B. By supplying the current amount adjustment signals A and B from an outside via the pads PD1 and PD2, the amount of the bit line leak current can be set easily in accordance with a test sequence.

Figure 5:
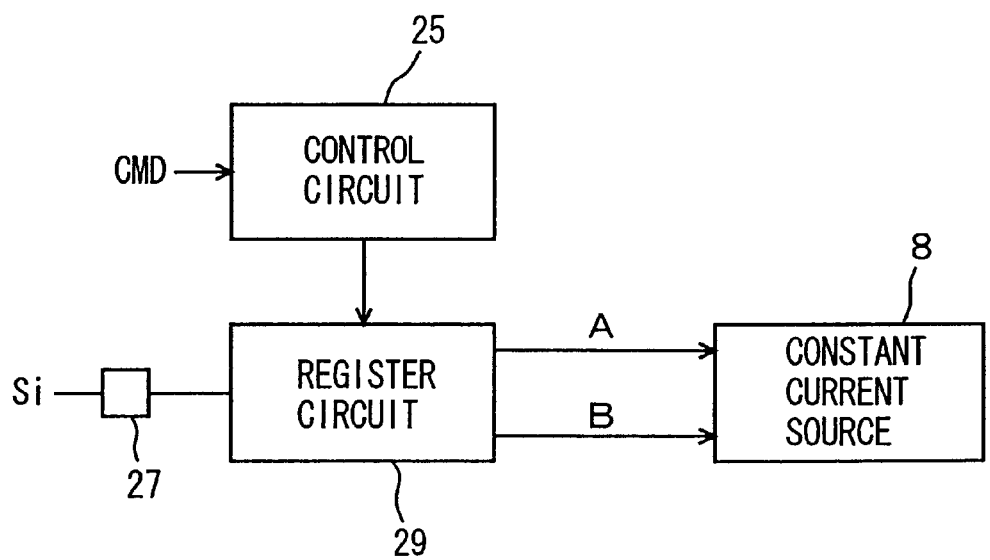
FIG. 5 is a diagram schematically showing another configuration of the control signal generation part shown in FIG. 3.

FIG. 5 is a diagram schematically showing another configuration of the part for generating the current amount adjustment signals. In FIG. 5, the current amount adjustment signal generation part includes a control circuit 25 for generating a register setting mode control signal in accordance with a command CMD from an outside and a register circuit 29 for storing a setting signal Si applied via a particular pad 27 under the control of the control circuit 25, to generate the current amount adjustment signals A and B. This control circuit 25 decodes the command CMD that instructs an operation mode, to generate an operation control signal for implementing the designated operation in accordance with the decoding result. For example, when a register setting command is applied, the register circuit 29 is coupled to a specific pad 27 under the control of the control circuit 25, to take in the signal applied to the specific pad 27 for generating the current amount adjustment signals A and B in accordance with the taken in signal.

This specific pad 27 may receive a specific address signal or the like in the function testing mode. The register circuit 29 may be a shift register circuit or may be a command register circuit which is usually provided for setting an operation mode in an embedded or merged DRAM or the like.

In the case of a configuration wherein this register circuit 29 is utilized, a setting command is applied for setting the current amount adjustment signals A and B. The current amount adjustment signal can be set in the register circuit 29 by using a pad that is not utilized at the time of application of this setting command. In the testing operation, by disconnecting this register circuit 29 from the pad 27, this pad 27 can be utilized as a pad that receives, for example, an address signal. Accordingly, the current amount adjustment signals A and B can be generated without the need for providing a specific pad dedicated for testing and without increasing the area occupied on the chip by the circuit.

In addition, in this case, the current amount adjustment signals A and B are generated by utilizing the command CMD and therefore, in the case that activation/deactivation of the test mode instruction signal /TME shown in the above FIG. 1 is controlled under the control of the control circuit 25, a test for a leak current can be performed even after the semiconductor memory device is mounted into a package (because the pad 27 receives a signal from an outside).

Here, the current driven by the constant current source 8 is merely required to be a current of a leak current through the micro short circuit or less (amount of current smaller than VBL/MZ when MZ is a short circuit resistance). Since a high speed operation is not required in the testing operation mode, the bit line potential can be sufficiently lowered by making the standby cycle period longer even when the bit line precharging potential is gradually lowered by this leak current. Accordingly, the bit line leak current can be precisely detected.

As described above, according to the first embodiment of the present invention, the precharging current of a bit line is made controllable. Thus, even in the case that the leak current of the bit line is very minute, the precharging potential of the bit line can be lowered without fail, so that the bit line defect can be easily detected reliably. In addition, this bit line defect is repaired by replacement with a not shown spare bit line pair and the corresponding bit line is disconnected from the precharging voltage transmission line. Thereby, the current consumption in a standby cycle can be reduced so that a semiconductor memory device with an extremely low standby current can be implemented.

Second Embodiment

Figure 6:
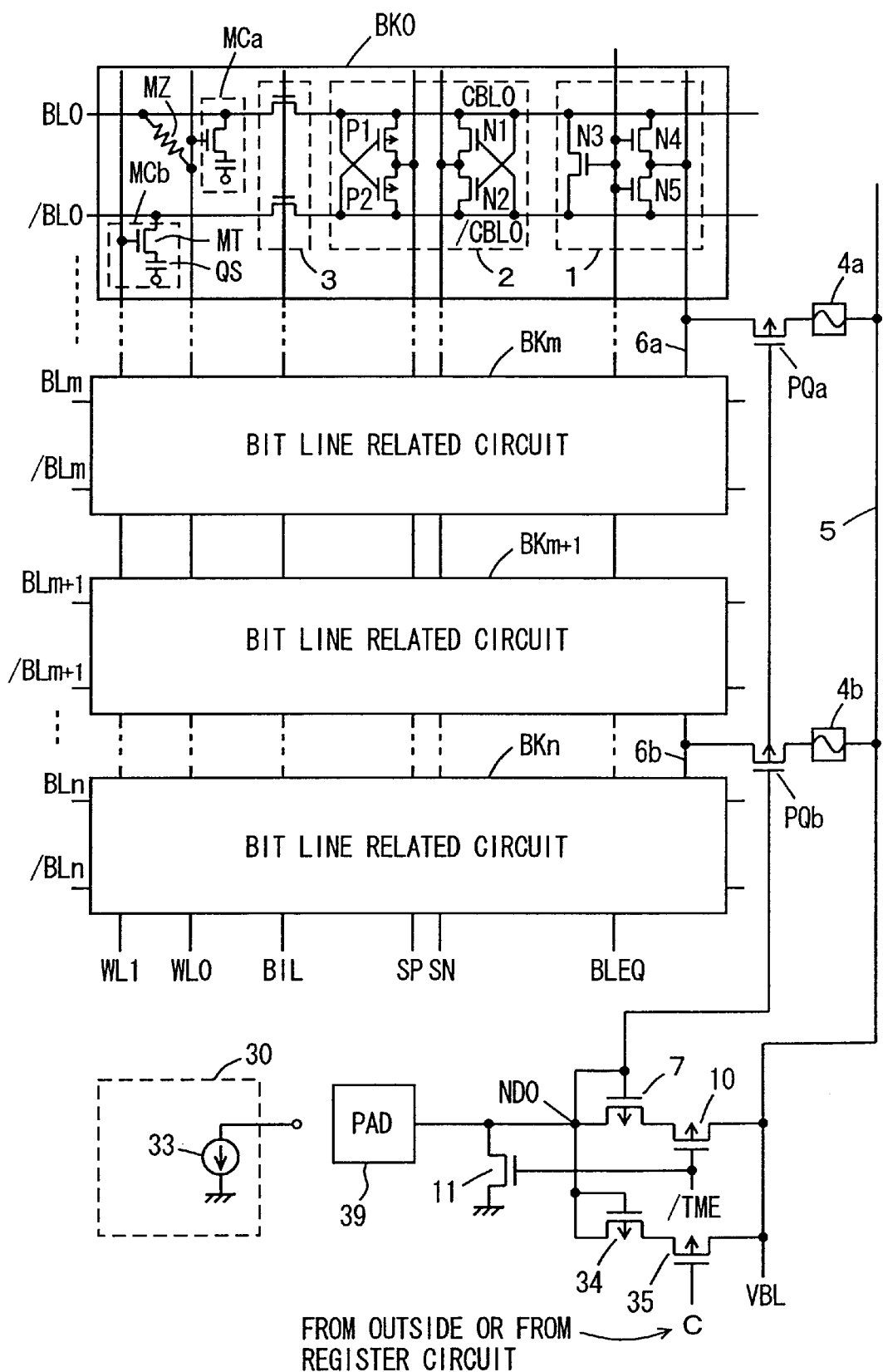
FIG. 6 is a diagram showing the configuration of a main part of a semiconductor memory device according to a second embodiment of the present invention.

FIG. 6 is a diagram showing the configuration of the main part of a semiconductor memory device according to the second embodiment of the present invention. In the configuration shown in this FIG. 6, a constant current that determines the amount of the detected leak current of a bit line is supplied (discharged) by a measuring device 30 provided outside. The constant current source 30, included in the outside measuring device 30, is connected to a pad 39 via a not shown probe.

The constant current circuit within the semiconductor memory device includes: a P channel MOS transistor 7 which forms a current mirror circuit with the MOS transistors PQa and PQb; a P channel MOS transistor 10 which is rendered conductive upon activation of the test mode instruction signal /TME, for connecting the MOS transistor 7 to the main intermediate voltage transmission line 5; a P channel MOS transistor 35 which is rendered conductive selectively in accordance with the current amount adjustment signal C; a P channel MOS transistor 34 which is connected between the MOS transistor 35 and the node ND0 and has a gate thereof connected to the node ND0; and an N channel MOS transistor 11 which is rendered conductive upon activation (the H level) of the test mode instruction signal /TME to drive the node ND0 to the ground potential level. The node ND0 is connected to the pad 39. The configuration of the memory array part is same as that in the configuration shown in FIG. 1 and the corresponding parts are denoted by the same reference numerals, and the detailed descriptions thereof are omitted.

In this configuration shown in FIG. 6, in the test mode, the test mode instruction signal /TME is set at the L level and the current amount adjustment signal C is set at the H level. The outside measuring device 30 connects the constant current source 33 to the pad 39 via a probe. In accordance with the test mode instruction signal /TME, the MOS transistor 10 enters the ON state, the MOS transistor 11 enters the OFF state, and the MOS transistor 7 is connected to the main intermediate voltage transmission line 5 to operate as a master stage of a current mirror circuit. The current amount adjustment signal C is at the H level and responsively, the MOS transistor 35 is in the OFF state while the MOS transistor 34 is disconnected from the main intermediate voltage transmission line 5.

Accordingly, in this state, the MOS transistor 7 draws out a current driven by the constant current source 33 from the main intermediate voltage transmission line 5, and therefore, the mirror current of the current driven by this constant current source 33 flows respectively via the MOS transistors PQa and PQb. In the case that a micro short circuit MZ exists between the word line WL0 and the bit line BL0 in the same manner as in the first embodiment, when the amount of current flowing via this MOS transistor PQa is smaller than the amount of the leak current which flows via this micro short circuit MZ, the bit line voltage is lowered in the bit lines BL0, /BL0 to BLm, /BLm. Accordingly, in the same manner as in the first embodiment, this leak current defect can be detected by carrying out a function test.

The level of this leak current can be set by means of the constant current source 33 included in the outside measuring device 30 so that the detection current level can easily be set at a desired value and a minute leak current can be detected without failure.

In the case that the current amount adjustment signal C is set at the L level, the MOS transistor 35 attains the ON state and the MOS transistor 34 is coupled to the main intermediate voltage transmission line 5. In this case, the MOS transistors 7 and 34 form the master stage of the current mirror circuit where the voltage level of the node MD0 varies and correspondingly the amount of the current which flows via the MOS transistors PQa and PQb can be made smaller. Specifically, a current is supplied to the constant current source 33 via the MOS transistors 7 and 34 and therefore, the amount of current flowing individually via the MOS transistors 34 and 7 becomes smaller, and correspondingly the amount of current flowing via the MOS transistors PQa and PQb becomes smaller. Accordingly, by setting this current adjustment signal C at the L level, the mirror ratio is made smaller to reduce the amount of current supplied to each bit line pair. Thus, a leak current at a current level lower than the leak current level set by the outside constant current source 33 can be detected.

In the outside measuring device 30, a leak current level which is the detection target can be changed without changing the current value driven by this constant current source 33, and accordingly the restrictions of the outside measuring device 30 can be made less. Specifically, even in the case that the amount of the driving current of this constant current source 33 is restricted, it becomes possible to detect a leak current level which is more minute level exceeding that restriction range.

In this second embodiment, the link element 4 (4a, 4b) is blown off for disconnection for each group of bit line pairs wherein a defect is detected in a function test, and the defect is repaired by carrying out a redundancy replacement and the standby current is reduced.

In the normal operation mode, the test mode instruction signal /TME is at the H level, while the current amount adjustment signal C is at the H level and the MOS transistors 10 and 35 are in the OFF state while the MOS transistor 11 is in the ON state. Thereby, the node ND0 is at the ground voltage level and currents corresponding to the amounts of the driving currents of the MOS transistors PQa and PQb are supplied to the bit line precharging/equalizing circuit 1.

Here, the current amount adjustment signal C may be directly applied from an outside via a pad, or may be set in a register circuit in the same manner as in the configuration shown in FIGS. 4 or 5. In particular, in the case that this current amount adjustment signal C is set in a register circuit, the current value driven by the constant current source 33 of the outside measuring device 30 is maintained at a constant level with the current amount adjustment signal C changed, and thereby, detection leak current level corresponding to the performance of each chip can be set and a product selection according to the difference in the standby current value can be achieved.

As described above, according to the second embodiment of the present invention, a constant current source provided in the outside measuring device sets the leak current level of bit lines so that the bit line leak current can be measured without increasing the area occupied on the chip by the detection circuit. In addition, with the current supplied by the constant current circuit provided internal this chip kept constant, by changing the mirror ratio, the detection leak current level can be easily changed, and a minute leak current at a desired level can be detected without being adversely affected by the restrictions of the measuring device.

Third Embodiment

Figure 7:
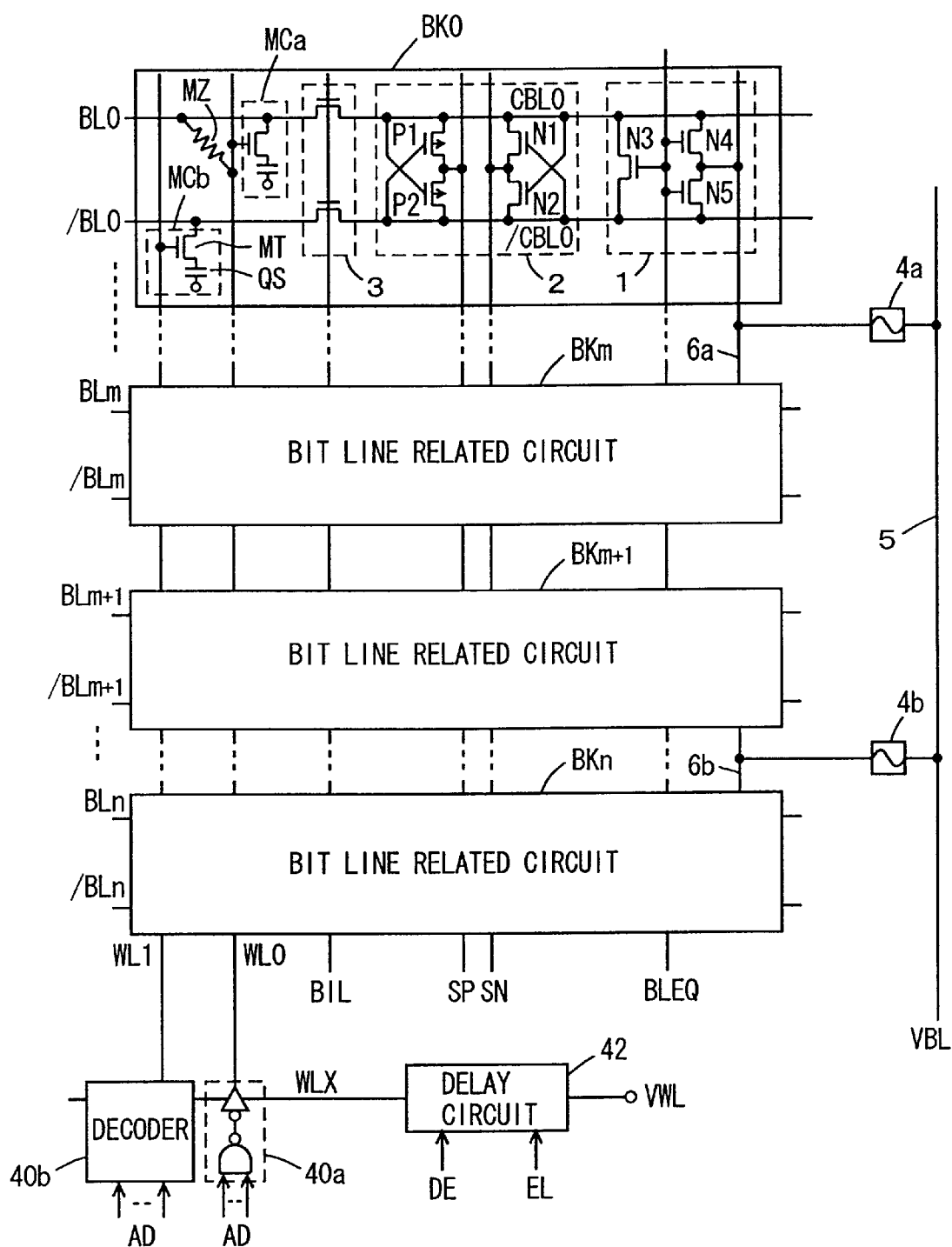
FIG. 7 is a diagram schematically showing the configuration of a main part of a semiconductor memory device according to a third embodiment of the present invention.

FIG. 7 is a diagram schematically showing the configuration of the main part of a semiconductor memory device according to the third embodiment of the present invention. In the configuration shown in this FIG. 7, the local intermediate voltage transmission lines 6a and 6b are coupled to the main intermediate voltage transmission line 5 via the link elements 4a and 4b, respectively. No MOS transistors for current restrictions are provided.

Figure 8:
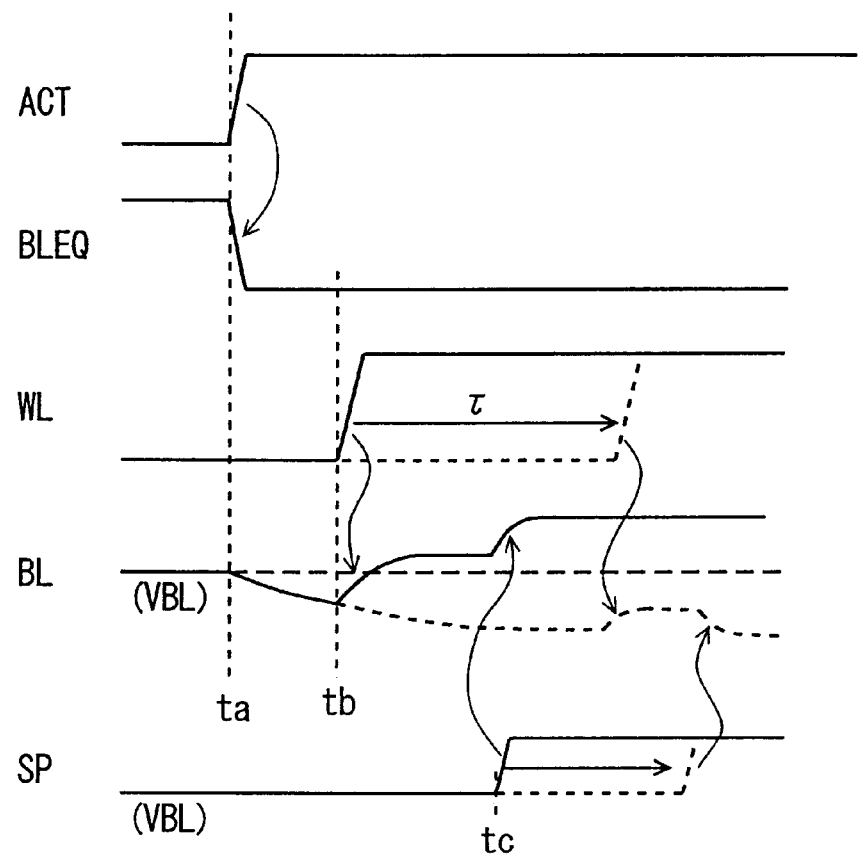
FIG. 8 is a signal waveform diagram representing the operation of the semiconductor memory device shown in FIG. 7.

Decoding circuits 40a, 40b, . . . which decode an address signal AD are arranged for the word lines WL0, L1, . . . These decoders 40a, 40b, . . . are provided with a common delay circuit 42, which in turn delays the word line driving signal VWL when activated. This delay circuit 42 delays the word line driving signal VWL upon activation of the delay activation signal DE for application to the decoders 40a, 40b, . . . This delay circuit 42 allows the delay time to be changed by means of a delay amount adjustment signal EL. The configurations of the bit line related circuits BK0 to BKn are the same as the above first and second embodiments and the corresponding parts are denoted by the same reference numerals. Now, the operation of the circuit shown in this FIG. 7 is described with reference to a signal waveform diagram shown in FIG. 8.

In the standby state before the time ta, the bit line precharging/equalizing signal BLEQ is at the H level and the bit line precharging/equalizing circuits are in the activate state to transmit the intermediate voltage VBL to the corresponding bit line pairs, respectively. Here, it is assumed that the resistance value of the micro short circuit MZ is sufficiently large and each bit line pair is precharged and equalized to the intermediate voltage level (Vcc/2), despite of the presence of this micro short circuit MZ, by means of the bit line precharging/equalizing circuit 1. The sense amplifier driving signals SP and SN are precharged and equalized to the intermediate voltage VBL level in the standby state (this configuration is described below).

A row activation command instructing the row selection is applied at the time ta, and accordingly, the array activation signal ACT is turned to the activate state of the H level. In response to the activation of this array activation signal ACT, the bit line precharging/equalizing signal BLEQ falls to the H level, the bit line precharging/equalizing circuit 1 is deactivated and the bit line pairs BL0, /BL0 to BLn, /BLn enter the floating state at the intermediate voltage level. In this floating state, a minute leak current is caused in the bit line BL (BL0) to which a micro short circuit MZ exists, and the voltage level thereof is lowered from the precharging voltage level.

At the time tb, the word line driving timing signal WLX is activated and the word line WL is driven into the selected state. In the case that the resistance value of the micro short circuit MZ is small, the voltage drop of this bit line BL is large and the voltage of this bit line BL lowers to the L level independent of the memory cell data. In the case that the resistance value of this micro short circuit MZ is large, however, the word line WL is selected and in the case that the H level data is read out on the bit line BL, the stored charge of that memory cell causes the voltage level of the bit line BL to increase above the intermediate voltage VBL, which is at the precharging voltage level of the other bit line /BL. The H level data corresponding to the data of the selected memory cell is transmitted to the bit line BL, with reference to the voltage of the bit line /BL. Accordingly, in the case that the sense amplifier driving signal SP is activated at the time tc in this state, a precise sensing operation is performed so that the existence of the micro short circuit MZ cannot be detected (or, at least, the existence position thereof cannot be specified).

Therefore, the word line driving signal VWL is delayed in accordance with the delayed activation signal DE in the delay circuit 42, and the activation timing of the word line driving timing signal WLX is delayed by time τ. The bit line BL enters the floating state during the period of time τ, starting from the time tb and therefore, even in the case that the resistance value of the micro short circuit MZ is extremely large and only a minute leak current flows, the voltage level of the bit line BL falls greatly. Then, even in the case that the word line WL is driven to the selected state or the memory cell data of the H level are read out at the bit line BL, the voltage level of this bit line BL does not exceed the intermediate voltage VBL of the precharging voltage of the other reference bit line /BL, and is at the L level with the voltage of the bit line /BL being the reference. Accordingly, even when the sense amplifier driving signal SP is activated thereafter, the bit line BL is driven to the L level by the N sense amplifier of the sense amplifier 2 and therefore, the L level data is always read out on the bit line BL, and thus the bit line defect (existence of a micro short circuit) can be detected by the function test.

The sense amplifier driving signal SP is generated in accordance with the activation of the word line driving timing signal WLX, as described in detail below, and by delaying the activation of the word line driving timing signal WLX, the activation timing of the sense amplifier driving signals SP and SN can be accordingly delayed. Therefore, by making longer the time period from the time when this bit line precharging/equalizing instruction signal BLEQ is turned into the deactivate state to the time when the word line driving timing signal is activated, the period of time while the bit line is in the floating state can be made longer, and accordingly, the voltage level of the bit line can be greatly reduced, even in the case that a minute leak current exits. A read out defect of the data is always caused in a defective bit line in the function test and therefore, the existence of this micro short circuit can be detected.

Here, the delay circuit 42 has the delay time thereof adjustable by means of the delay amount adjustment signal EL and the time τ is adjusted by the amount that the word line activation is delayed and thereby, the detection leak current level can be determined. The delay time of the delay circuit 42 is set in accordance with the period of time that the charge Cb·VBL stored in the parasitic capacitance Cb of the bit line is discharged via the micro short circuit MZ and thereby, the detection leak current level can be set. The magnitude of the read out voltage which appears on the bit line due to the charge from the memory cell can be found by the capacitance value of the memory cell capacitor and the cell plate voltage. Accordingly, the delay time of the delay circuit 42 is set so that the bit line BL attains a voltage level sufficiently lower than the intermediate voltage level of the precharging voltage of the other bit line, even when the H level data is read out.

Figure 9:
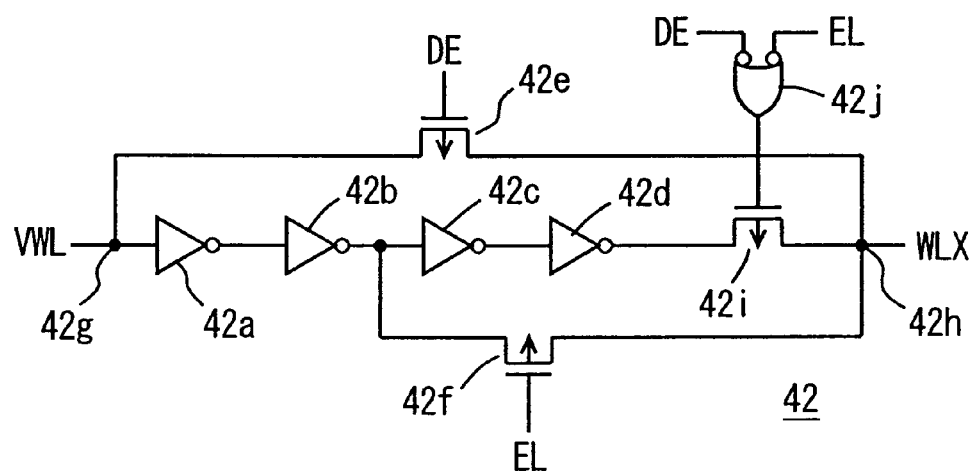
FIG. 9 is a diagram showing an example of a configuration of the delay circuit shown in FIG. 7.

FIG. 9 is a diagram showing an example of the configuration of the delay circuit 42 shown in FIG. 7. In FIG. 9, the delay circuit 42 includes inverter circuits 42a to 42d cascaded and coupled to the input mode 42g, a transfer gate 42e rendered conductive upon deactivation of the delayed activation signal DE for connecting the input node 42g to the output node 42h, the transfer gate 42f rendered conductive when the delay adjustment signal EL is at the L level, for connecting the output of the inverter 42b to the output node 42h, a NAND circuit 42j receiving the delayed activation signal DE and the delay adjustment signal DIGITAL, and a transfer gate 42I rendered conductive when the output signal of the NAND circuit 42j is at the H level, for connecting the output of the inverter 42d to the output node 42h.

Though the transfer gates 42e, 42f and 42i are formed of P channel MOS transistors, they may be formed of CMOS transfer gates, or they may be formed of tri-state buffers.

In the normal operation mode, the delayed activation signal DE is at the L level and the delay adjustment signal EL is at the H level. Responsively, the transfer gates 42f and 42i are in the OFF state and the transfer gate 42e is in the conductive state so that the input node 42g is connected to the output node 42h. Accordingly, the word line driving timing signal WLX is generated in accordance with the word line driving signal VWL.

In the test mode, when the delay activation signal DE is set at the H level, the transfer gate 42e enters the non-conductive state. At this time, if the delay adjustment signal EL is at the H level, the output signal of the NAND circuit 42j attains the L level and the transfer gate 42i becomes conductive, and the delay circuit 42 is formed of the inverters 42a to 42d. Thus, the word line driving timing signal WLX is activated after the delay time provided by the inverters 42a to 42d since the word line driving signal VWL is activated. When the delay adjustment signal EL is at the L level, the output signal of the NAND circuit 42j is at the H level. Accordingly, the transfer gate 42i enters the non-conductive state and the transfer gate 42f enters the conductive state, so that the delay circuit 42 is formed of the inverters 42a and 42b, and the delay time is shortened. The delay time provided by this delay circuit 42 can be adjusted by means of the delay adjustment signal EL.

Here, the configuration of the delay circuit shown in this FIG. 9 is merely an example and any delay circuit can be utilized as long as it has the configuration where the delay operation is activated in accordance with the delay activation signal DE and the delay time is adjusted in accordance with the delay adjustment signal EL. In addition, a plurality of delay times implemented by this delay circuit 42 may be provided (by utilizing a plurality of delay adjustment signals).

These delay control signals DE and EL may be directly applied from an outside or may be set in the register circuit.

Figure 10:
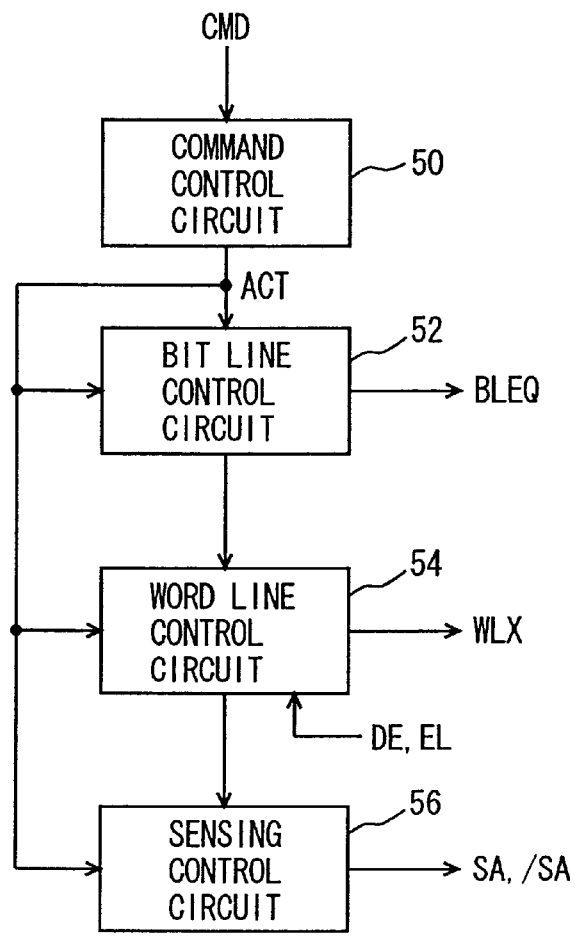
FIG. 10 is a diagram schematically showing the configuration of the row related control circuit in the third embodiment of the present invention.

FIG. 10 is a diagram schematically showing the configuration of the row related control circuit in the third embodiment of the present invention. In FIG. 10, the configuration includes a command control circuit 50 for activating the array activation signal ACT in accordance with the command CMD from an outside, a bit line control circuit 52 for deactivating the bit line precharging/equalizing signal BLEQ in accordance with the activation of the array activation signal ACT from the command control circuit 50, a word line control circuit 54 for generating a word line driving timing signal WLX in accordance with the bit line precharging equalizing instruction signal BLEQ from this bit line control circuit 52, and a sensing control circuit 56 for activating sense amplifier activation signals SA and /SA in accordance with the word line driving timing signal WLX outputted from the word line control circuit 54. The bit line control circuit 52, the word line control circuit 54 and the sensing control circuit 56 also receive the array activation signal ACT.

The command control circuit 50 activates the array activation signal ACT when a row activation command that instructs the row selection is applied as a command CMD from the outside, and deactivates the array activation signal ACT when a precharging command that instructs the return to the precharging state is applied.

The bit line control circuit 52 is formed of, for example, a flip-flop, and deactivates/activates the bit line precharging/equalizing instruction signal BLEQ in accordance with the activation/deactivation of this array activation signal ACT.

The word line control circuit 54 includes the delay circuit 42 shown in FIG. 7, and the delay time thereof is adjusted in accordance with the delay activation signal DE and the delay amount adjustment signal EL, and the word line driving timing signal WLX is activated after a set delay time has passed since the bit line precharging/equalizing instruction signal BLEQ is deactivated. When the array activation signal ACT is deactivated, this word line control circuit 54 accordingly deactivates the word line driving signal WLX.

The sensing control circuit 56 is formed, substantially, of a delay circuit, and activates the sense amplifier activation signals SA and /SA after a predetermined time has passed subsequent to the activation of the word line driving timing signal WLX. When the array activation signal ACT is deactivated, this sensing control circuit 56 deactivates the sense activation signals SA and /SA after the word line driving signal WLX is deactivated.

Accordingly, the configuration of this row related circuit can delay the activation timing of the sense activation signals SA and /SA, from this sensing control circuit 56 by merely delaying the activation timing of the word line driving timing signal WLX, and therefore, the sense amplifier activation timing can also be delayed in accordance with the word line selection timing in a minute leak current detection.

Figure 11:
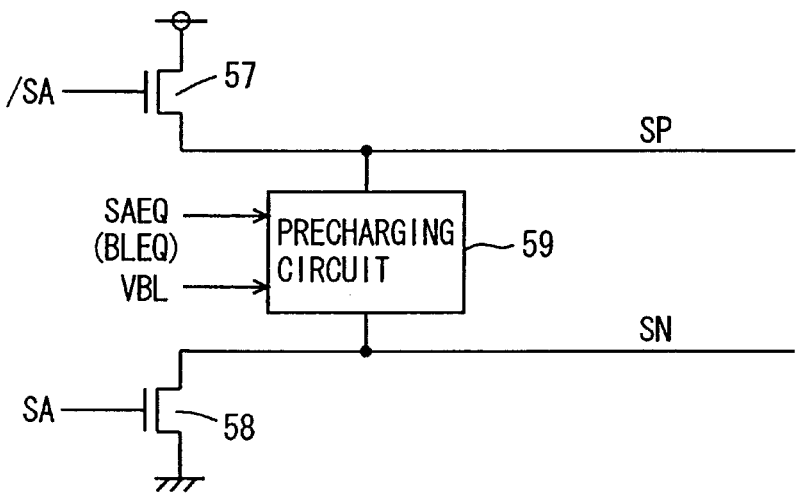
FIG. 11 is a diagram schematically showing the configuration of a part of generating the sense amplifier driving signal shown in FIG. 7.

FIG. 11 is a diagram schematically showing the configuration of a part for generating the sense amplifier driving signals SP and SN. In FIG. 11, the sense amplifier driving signal generation part includes a P sense amplifier activation transistor 57 rendered conductive upon activation of the sense amplifier activation signal /SA, for driving the sense amplifier driving signal SP to the power source voltage level, an N sense amplifier activation transistor 58 rendered conductive upon activation of the sense amplifier activation signal SA, for driving the sense amplifier driving signal SN to the ground voltage level, and a precharging circuit 59 activated upon activation of the sense precharging/equalizing instruction signal SAEQ, for precharging and equalizing the sense amplifier driving signals SP and SN to the intermediate voltage VBL level.

This sense precharging/equalizing instruction signal SAEQ is activated/deactivated at the same timing as for the bit line precharging/equalizing instruction signal BLEQ.

By precharging and equalizing to the intermediate voltage VBL level in the standby state of these sense amplifier driving signals SP and SN, a leak current is prevented from occurring in the sense amplifier when the common bit lines CBL and /CBL are precharged and equalized to the intermediate voltage VBL level. In addition, the sense operation is started at a high speed by allowing the amplitudes of the sense amplifier driving signals SP and SN to be smaller at the time of the sensing operation.

Here, in the row related control circuit shown in FIG. 10, the configuration of the part for generating a bit line isolation instruction signal BIL is not shown. This bit line isolation instruction signal BIL is normally activated/deactivated in accordance with a block selection signal.

As described above, according to the third embodiment of the present invention, the word line selection starting timing is delayed in the test mode and the bit line voltage can be sufficiently lowered by means of a minute leak current. A bit line leak current defect can be detected by means of the subsequently performed function test so that a semiconductor memory device which operates precisely with an extremely low standby current can be implemented by means of defect repair through redundancy replacement and by stopping the current supply through the blowing off of the link element.

Fourth Embodiment

Figure 12:
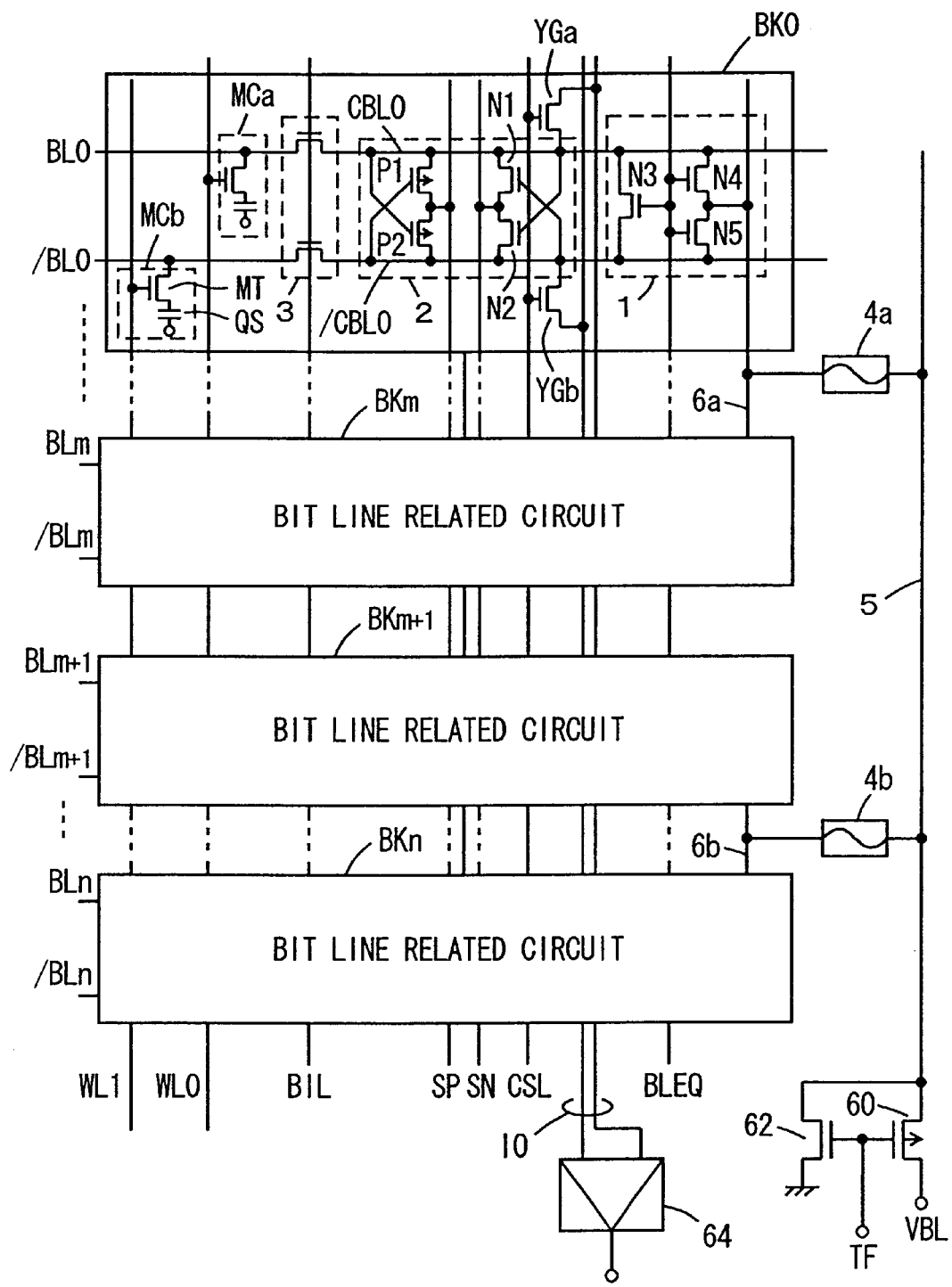
FIG. 12 is a diagram showing the configuration of a main part of a semiconductor memory device according to a fourth embodiment of the present invention.

FIG. 12 is a diagram schematically showing the configuration of the main part of a semiconductor memory device according to the fourth embodiment of the present invention. In the configuration shown in this FIG. 12, a P channel MOS transistor 60 and an N channel MOS transistor 62, receiving a test mode instruction signal TF on their gates, are connected to the main intermediate voltage transmission line 5. The MOS transistor 60 transmits the intermediate voltage VBL to the main intermediate voltage transmission line 5 when made conductive, while the MOS transistor 62 transmits the ground voltage to the main intermediate voltage transmission line 5 when made conductive.

The main intermediate voltage transmission line 5 is coupled to the local intermediate voltage transmission lines 6a and 6b via the link elements 4a and 4b, respectively.

The MOS transistors 60 and 62 are rendered conductive complementarily to each other in accordance with the test mode instruction signal TF. In the normal operation mode (other than the test mode of leak current detection), the test mode instruction signal TF is at the L level and the MOS transistor 60 is rendered conductive to transmit the intermediate voltage VBL to the main intermediate voltage transmission line 5. On the other hand, when the test mode instruction signal TF is at the H level, the MOS transistor 60 enters the OFF state and the main intermediate voltage transmission line 5 is disconnected from the circuit that generates the intermediate voltage VBL. The MOS transistor 62 is rendered conductive and the main intermediate voltage transmission line 5 is connected to the ground node, and the voltage level thereof is fixed at the ground voltage level.

The bit line related circuits BK0 to BKn are provided, respectively, with the Y gates YGa and YGb which are rendered selectively conductive in accordance with column selection signals on the column selection lines CSL, for connecting the corresponding common bit lines CBL, /CBL (CBL0, /CBL0) to the internal data line pair IO. The internal data line pair IO is coupled to a preamplifier 64. This preamplifier 64 amplifies complementary data on the internal data line pair IO when made activate, to transmit the amplified internal read out data to an output circuit, which in turn is not shown.

The remaining configuration of the bit line related circuits BK0 to BKn is the same as the above first to third embodiments and the corresponding parts are denoted by the same reference numerals.

In the normal operation mode, the test mode instruction signal TF is maintained at the L level and the MOS transistor 62 is in the OFF state while the MOS transistor 60 is in the ON state. Accordingly, the intermediate voltage VBL is transmitted to the main intermediate voltage transmission line 5. When the link elements 4a and 4b are in the conductive state, the intermediate voltage VBL is transmitted to the bit line related circuits BK0 to BKn via the local intermediate voltage transmission lines 6a and 6b. In the memory cell selection, the word line of an addressed row is driven to the selected state and then a sensing operation is performed so that the data of a memory cell on the selected row is sensed, amplified and latched by the sense amplifier.

When a column access command, instructing the column selection, is applied, the bit line pair (common bit line pair) corresponding to an addressed column is selected in accordance with the column selection signals on the column selection lines CSL so that the bit line pair of the selected column is coupled to the internal data line pair IO, and then the writing in/reading out of the data is performed.

Figure 13:
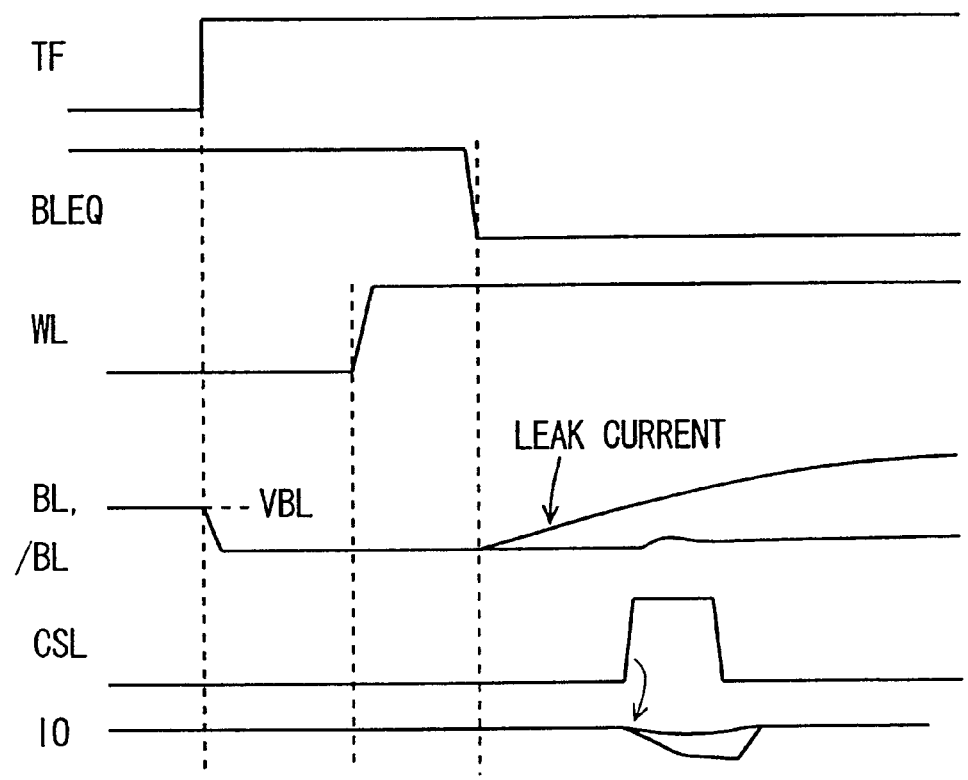
FIG. 13 is signal waveform diagram representing the operation of the semiconductor memory device shown in FIG. 12.

In the test operation mode, as shown in FIG. 13, the test mode instruction signal TF is set at the H level and the main intermediate voltage transmission line 5 is set forcibly at the ground voltage level. At this time, when the memory device is in the standby state and the bit line precharging/equalizing instruction signal BLEQ is set at the H level, the bit line precharging/equalizing circuit 1 is activated in the bit line related circuits BK0 to BKn and the bit lines BL0, /BL0 to BLn, /BLn are all precharged and equalized to the ground voltage level.

Then, in the memory array part connected via this bit line isolation gates 3, the word lines WL are all driven to the selected state. In the case that a micro short circuit exists, a minute leak current flows into the bit line from the selected word line via the micro short circuit. However, since the bit line precharging/equalizing circuit 1 is in the activate state, a current supplied from this selected word line via the micro short circuit is totally discharged to the ground node.

In addition, in the case that all of the word lines WL are driven into the selected state, data of the memory cells connected to the selected word lines are all forced to the L level in accordance with the voltages of the bit lines BL and /BL (BL0, /BL0 to BLn, /BLn). Accordingly, by driving all of the word lines WL to the selected state under the state where this bit line precharging/equalizing circuit 1 is maintained in the activate state, the memory data of all of the memory cells can be forcibly set at the L level without writing the L level data into the memory cells in the test mode.

Then, under the state that the word line WL is maintained in the selected state, the bit line precharging/equalizing instruction signal BLEQ is driven to the deactivate state so that the bit line precharging/equalizing circuit 1 is deactivated. Thereby, the bit lines BL0, /BL0 to BLn, /BLn are all disconnected from the corresponding local intermediate voltage transmission lines 6a and 6b. Accordingly, in the case that no micro short circuits exist, these bit lines attain the floating state at the ground voltage level. In the case that a micro short circuit exists, since the voltage level of a selected word line is at the H level, a leak current flows from the selected word line WL to the corresponding bit line via the micro short circuit. Even in the case that the leak current, flowing via this micro short circuit, is a minute current, a voltage difference can be generated between the bit lines /BL or BL making a pair with the bit line BL or /Bl having a micro short circuit connected, by maintaining this word line WL in the selected state for a sufficiently long period of time. Here, normally the micro short circuit is likely to occur in one bit line of a bit line pair.

Then, column selection signals on the column selection lines CSL are driven in sequence to the selected state (column selection signals of different column addresses are applied to the bit line related circuits BK0 to BKn) and the voltages of the bit line pairs BL0, /BL0 to BLn, /BLn are transmitted in sequence to the internal data line pair IO and then detected by the preamplifier 64.

In the case that a leak current caused by a micro short circuit exists, the H level data are always read out. In the case that no leak current paths exist, the L level data are transmitted to the internal data line of this internal data line pair IO. The data lines of this internal data line pair IO are both determined to be at the L level in the test mode in the preamplifier 64 and thereby, it can be detected that no leak current paths exist.

In a DRAM a row access command that instructs the row selection and a column access command that instructs the column selection are applied in a time division multiplexing manner. Therefore, the application time difference between this row access command and this column access command is adjusted by the outside test device (measuring device) and thereby, the bit line voltage can be sufficiently raised even by a minute leak current.

Figure 14:
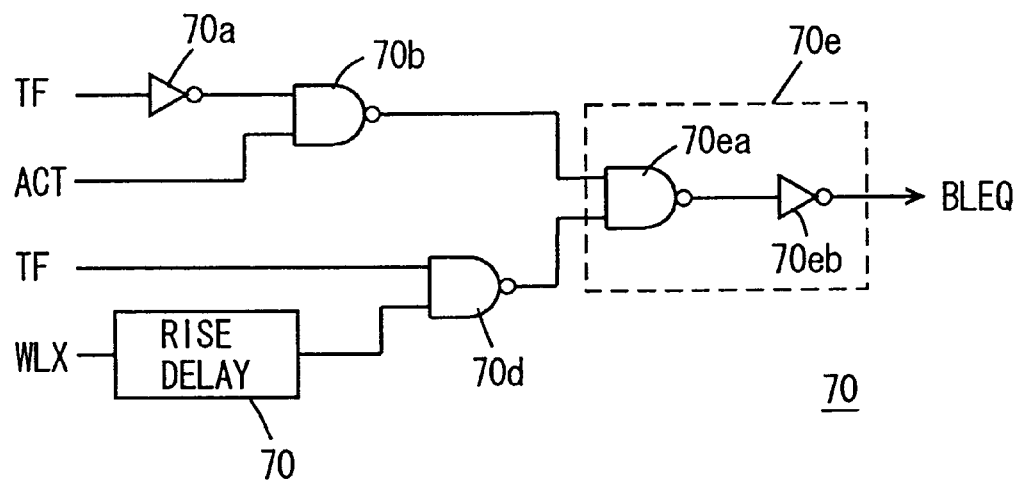
FIG. 14 is a diagram showing an example of a configuration of a part generating a bit line precharging/equalizing instruction signal shown in FIG. 12.

FIG. 14 is a diagram showing an example of the configuration of a BLEQ control circuit used in the fourth embodiment of the present invention. In FIG. 14 the BLEQ control circuit 70 includes: an inverter 70*a* receiving a test mode instruction signal TF; a NAND circuit 70*b* receiving an output signal of the inverter 70*a* and an array activation signal ACT; a rise delay circuit 70*c* delaying the rise (activation) of the word line driving timing signal WLX by a predetermined period of time; a NAND circuit 70*b* receiving a test mode instruction signal TF and an output signal of the rise delay circuit 70*c*; and an AND circuit 70*e* receiving output signals of the NAND circuits 70*b* and 70*d*, to generate a bit line precharging/equalizing instruction signal BLEQ. This AND circuit 70*e* includes a NAND gate 70*ea* which receives output signals of the NAND circuits 70*b* and 70*d*, and an inverter 70*eb* which inverts an output signal of the NAND gate 70*ea* to generate the bit line precharging/ equalizing instruction signal BLEQ.

The test mode instruction signal TF is at the L level, in a mode except the mode of detecting a minute leak current. Under this state, the output signal of the inverter 70*a* is at the H level and the NAND circuit 70*b* operates as an inverter. The test mode instruction signal TF is at the L level and therefore, the output signal of the NAND circuit 70*d* is maintained at the H level. When the array activation signal ACT is activated to rise to the H level, the output signal of the NAND circuit 70*b* falls to the L level and accordingly, the bit line precharging/equalizing instruction signal BLEQ, generated from the AND circuit 70*e*, falls to the L level to complete the precharging/equalizing operation of the bit lines.

On the other hand, when the test mode instruction signal TF is at the H level, the output signal of the inverter 70*a* turns to the L level and the output signal of the NAND circuit 70*b* is fixed at the H level. When the word line driving timing signal WLX is activated in accordance with the activation of the array activation signal ACT, the output signal of the NAND circuit 70*d* transitions to the L level after the delay time, provided by the rise delay circuit 70*c*, has passed. Accordingly, the bit line precharging/equalizing instruction signal BLEQ generated from the AND circuit 70*e* falls to the L level.

Accordingly, in this test mode, the precharging/equalizing of the bit lines can be performed under the state where the word lines WL are maintained in the selected state, so that the bit lines BL and /BL can all be set at the L level independently of the storage data of the memory cells.

The delay time provided by the rise delay circuit 70 may also be made variable.

The activation of this bit line precharging/equalizing instruction signal BLEQ is performed in accordance with the array activation signal ACT when the test mode instruction signal TF is at the L level, while it is performed in accordance with the deactivation of the word line driving timing signal WLX when the test mode instruction signal TF is at the H level. Thereby, in any operation mode, the bit line precharging/equalizing instruction signal BLEQ can be activated after the word line is driven to the non-selected state.

Figure 15:
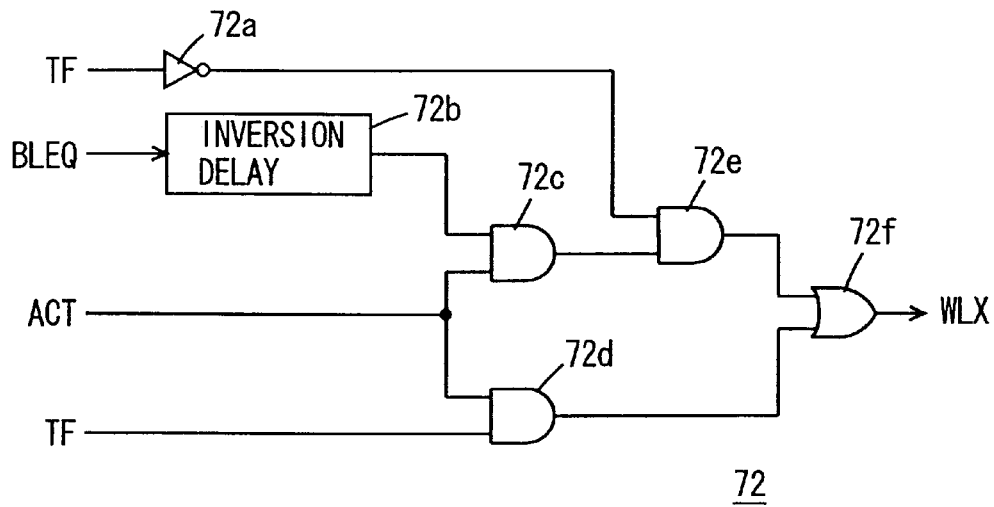
FIG. 15 is a diagram showing an example of a configuration of the word line driving signal generation part in the fourth embodiment of the present invention.

FIG. 15 is a diagram showing an example of the configuration of a part for generating a word line driving timing signal WLX in the fourth embodiment of the present invention. In FIG. 15, the word line driving timing signal generation part 72 includes: an inverter 72*a* receiving the test mode instruction signal TF; an inversion delay circuit 72*b* for inverting and delaying, by a predetermined period of time, the bit line precharging/equalizing instruction signal BLEQ; an AND circuit 72*c* receiving the array activation signal ACT and the output signal of the inversion delay circuit 72*b*; an AND circuit 72*e* receiving the output signal of the inverter 72*a* and the output signal of the AND circuit 72*c*; an AND circuit 72*d* receiving the array activation signal ACT and the test mode instruction signal TF; and an OR circuit 72*f* receiving the output signals of the AND circuits 72*d* and 72*e* to generate the word line driving timing signal WLX.

When the test mode instruction signal TF is at the L level, the output signal of the inverter 72*a* is at the H level, and the AND circuit 72*e* is enabled while the AND circuit 72*d* is disabled. When the array activation signal ACT is activated, the bit line precharging/equalizing instruction signal BLEQ attains the L level and when the delay time provided by the inversion delay circuit 72*b* passes, the output signal of this inversion delay circuit 72*b* attains the H level. Responsively, the output signal of the AND circuit 72*c* attains the H level and the word line driving timing signal WLX, generated from the OR circuit 72*f*, is driven to the H level.

When the test mode instruction signal TF is at the H level, the output signal of the inverter 72*e* attains the L level, and the output signal of the AND circuit 72*e* attains the L level. When the AND circuit 72*d* is enabled and the array activation signal ACT is activated, the word line driving timing signal WLX, generated from the OR circuit 72*f*, is driven to the active state of the H level.

When the array activation signal ACT is driven to the inactive state of the H level, the word line driving timing signal WLX is, accordingly, driven to the inactive state irrelevant to whether the test mode instruction signal TF is at the H level or at the L level.

Figure 16:
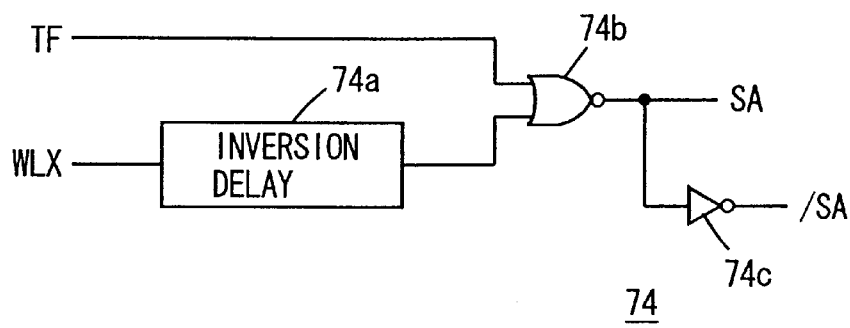
FIG. 16 is a diagram showing an example of the configuration of the sense amplifier activation signal generation part in the fourth embodiment of the present invention.

FIG. 16 is a diagram showing an example of the configuration of a part for generating sense amplifier activation signals SA and /SA in the fourth embodiment of the present invention. In FIG. 16, the sense amplifier activation signal generation part 74 includes: an inversion delay circuit 74*a* inverting and delaying, by a predetermined period of time, the word line driving timing signal WLX; a NOR circuit 74*b* receiving the test mode instruction signal TF and the output signal of the inversion delay circuit 74*b* to generate a sense amplifier activation signal SA; and an inverter 74*c* inverting the output signal of the NOR circuit 74*b* to generate a sense amplifier activation signal /SA.

This inverter 74*c* is a delay inverter that activates the sense amplifier activation signal /SA after the sense amplifier activation signal SA is activated. These sense amplifier activation signals SA and /SA are applied to the sense amplifier activation transistors 58 and 57, respectively, as shown in FIG. 11.

When the test mode instruction signal TF is at the L level, the NOR circuit 74b operates as an inverter. When the output signal of the inversion delay circuit 74a falls to the L level in response to activation of the word line driving timing signal WLX, the sense amplifier activation signal SA is driven to the H level of the activated state, and the sense amplifier activation signal /SA, generated from the inverter 74c, is driven to the activated state of the L level. After the word line driving timing signal WLX is returned to the inactive state, the sense amplifier activation signals SA and /SA are deactivated.

When the test mode instruction signal TF is at the H level, the sense amplifier activation signal SA from the NOR circuit 74b is at the L level and the sense amplifier activation signal /SA from the inverter 74c is at the H level, and therefore the sense amplifier maintains the inactive state. Specifically, no sensing operation is performed in this test mode. The potential difference caused between the bit lines is transmitted to the internal data line. Thereby, in the case that no micro short circuits exist and the bit lines BL and /BL are both maintained at the ground potential, to prevent the sense amplifier from malfunctioning and from carrying out an erroneous sensing operation.

Here, in the sense amplifier activation signal generation part 74 shown in this FIG. 16, the inversion delay circuit 74a may be a combination of the rise delay circuit and the inversion circuit. The sensing operation start timing is merely so delayed as to follow the word line activation timing, and the sense amplifier is deactivated at a high speed, after the word line deactivation, in response to deactivation of this sense amplifier activation signal.

In addition, alternatively, the sense amplifier activation signal SA may be generated through the ANDing operation on the array activation signal ACT and the output signal of the NOR circuit 74b.

The sense amplifier driving signals SP and SN are driven to the intermediate voltage VBL level in accordance with bit line precharging/equalizing instruction signal BLEQ (sense amplifier precharging/equalizing instruction signal SAEQ) in this fourth embodiment. In the case that the precharging voltage of the sense amplifier is transmitted from the same main intermediate voltage transmission line 5, the sense amplifier driving signals SP and SN are driven to the ground voltage level. Thereby, in the test mode, the sense amplifier is maintained in the inactive state so that the voltage difference, caused by a minute leak current that occurs in the bit line, can be precisely transmitted to the internal data line pair.

Figure 17:
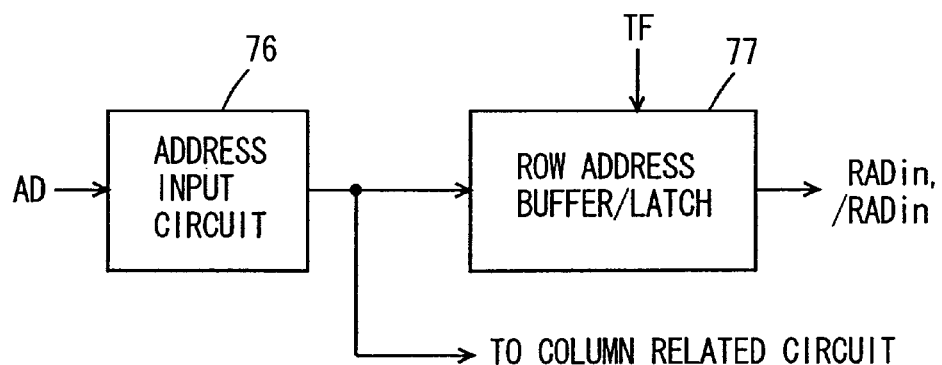
FIG. 17 is a diagram schematically showing the configuration of the internal row address signal generation part in the fourth embodiment of the present invention.

FIG. 17 is a diagram schematically showing the configuration of a part related to the address signal. In FIG. 17, the row address generation part includes: an address input circuit 76 which takes in an externally applied address signal AD; and a row address buffer/latch 77 for buffering and latching an internal address signal received from the address input circuit 76 to generate complementary internal row address signals RADin and /RADin. The test mode instruction signal TF is applied to the row address buffer/latch 77.

When the test mode instruction signal TF is at the H level, the row address buffer/latch 77 sets both of the internal row address signals RADin and /RADin at the selected state of the H level, and all of the word lines WL are driven to the selected state. Here, in the partial activation arrangement of a block division configuration, all of the word lines in one memory block are selected.

The internal column address signal from the address input circuit 76 is applied to the column related circuit (column address buffer/latch) and the like, and is utilized for the column selection.

By applying the test mode instruction signal TF to the row address buffer/latch 77, all of the word lines (in one memory block) can be easily driven to the selected state. This row address buffer/latch 77 takes in and latches the address signal from the address input circuit 76 at the time of activation of the array activation signal ACT.

Figure 18:
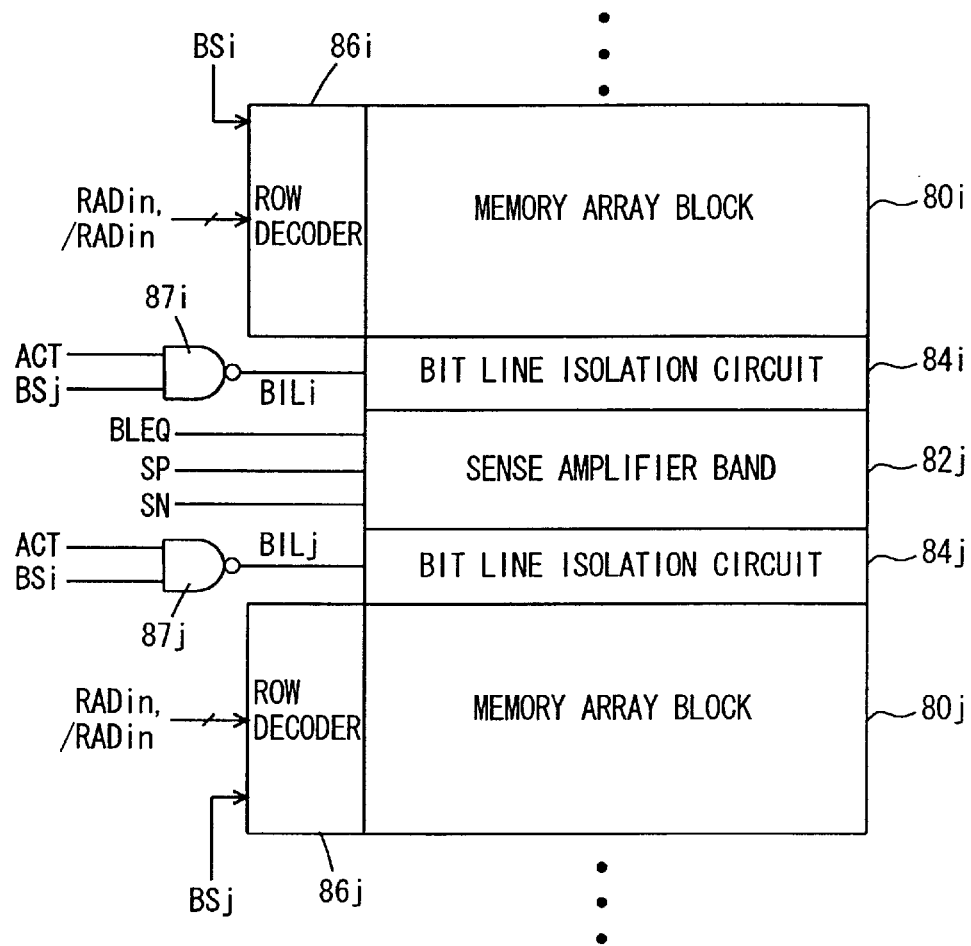
FIG. 18 is a diagram schematically showing the configuration of an array part of a semiconductor memory device according to the present invention.

FIG. 18 is a diagram schematically showing the configuration of a memory array part. Though the memory array is divided into a plurality of memory array blocks, two memory array blocks 80i and 80j are representatively shown in FIG. 18.

A sense amplifier band 82j is arranged between these memory array blocks 80i and 80j. This sense amplifier band 82j includes sense amplifiers provided corresponding to the columns (bit line pairs) of the memory array blocks 80i and 80j, bit line precharging/equalizing circuits which precharge common bit lines of the respective sense amplifiers to the intermediate voltage level, and sense precharging/equalizing circuits which precharge and equalize the sense amplifier driving signal lines to the intermediate voltage level. Further, a column selection gates for column selection are arranged in the sense amplifier band 84j.

The sense amplifier band 82j is connected to the memory array block 80i via the bit line isolation circuit 84i and is coupled to the memory array block 80j via the bit line isolation circuit 84j.

The bit line isolation circuits 84i and 84j each include a bit line isolation gates provided corresponding to the bit line pairs of the memory array blocks 80i and 80j, respectively.

The bit line isolation circuit 84i includes a NAND circuit 87i which receives the array activation signal ACT and the array block designation signal BSj, and the bit line isolation circuit 84j includes a NAND circuit 87j which receives the array activation signal ACT and the array block designation signal BSi. The NAND circuits 87i and 87j each have a level conversion function, and generate bit line isolation instruction signals BILi and BILj, the H level of which is the high voltage level, for application to the bit line isolation circuits 84i and 84j, respectively.

The block designation signals BSi and BSj are the signals generated by decoding a block address signal received from the address input circuit 76 shown in FIG. 17. The block designation signal BSi designates the memory array block 80i when activated, and the block designation signal BSi designates the memory array block 80j when activated.

Accordingly, in the arrangement that a word line selection is performed in one of the memory array blocks 80i and 80j sharing the sense amplifier band 82j, the other memory array block is isolated from the sense amplifier band 82a by the bit line isolation circuit. Specifically, when the block designation signal BSj attains the H level and the memory array block 80j is designated, the bit line isolation instruction signal BILi attains the L level and the bit line isolation circuit 84i enters the non-conductive state. When the array block designation signal BSi attains the H level and the memory array block 80i is designated, the bit line isolation instruction signal BILj attains the L level and the bit line isolation circuit 84j enters the non-conductive state to isolate the memory array block 80j from the sense amplifier band 82i.

Row decoders 86i and 86j are provided corresponding to the memory array blocks 80i and 80j, respectively. These row decoders 86i and 86j are activated upon activation of the memory array block designation signals BSi and BSj, respectively, to decode the internal row address signals RADin and /RADin received from the row address buffer/latch 77 shown in FIG. 17, for driving the word line corresponding to an addressed row in the corresponding memory array block 80*i* or 80*j* to the selected state.

Accordingly, when a minute leak current detection is performed in the memory array block 80*i*, the memory array block 80*i* is connected to the sense amplifier band 82*j*, and the row decoder 86*i* drives all of the word lines within the memory array block 80*i* into the selected state in accordance with the row address signals RADin and /RADin. In this state, the bit line isolation circuit 84*j* is in the non-conductive state.

Accordingly, a short circuit between bit lines and word lines can be detected for each memory array block.

When the detection of a minute current is performed with these memory array blocks being units, defect repair may be performed with the memory array block being a unit, or defect repair may be performed with a group of a predetermined number of columns within the memory array block being a unit. Since the memory cell data are read out with columns being units, the position of a bit line short circuit defect can be specified.

Here, the bit line precharging/equalizing instruction signal BLEQ as well as the sense amplifier driving signal SP and SN, which are applied to the sense amplifier band 82*j*, are activated/deactivated in accordance with signals from the circuits shown in the FIGS. 14 to 16, respectively, when one of the array block designation signals BSi and BSj is in the active state.

Figure 19:
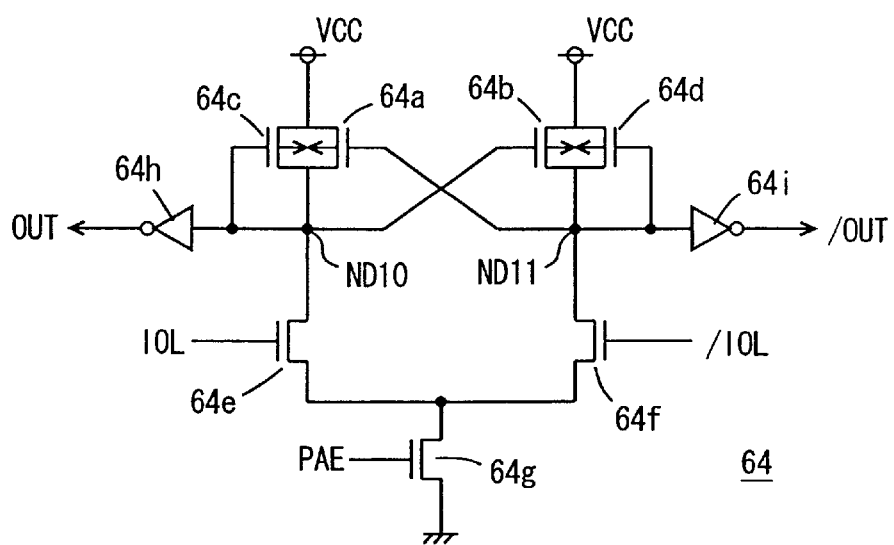
FIG. 19 is a diagram showing an example of the configuration of the preamplifier shown in FIG. 12.

FIG. 19 is a diagram showing an example of the configuration of the preamplifier 64 shown in FIG. 12. In FIG. 19, the preamplifier 64 includes: a P channel MOS transistor 64*a* connected between the power source node and the node ND10 and having a gate connected to the node ND11, a P channel MOS transistor 64*b* connected between the power source node and the node ND11 and having a gate connected to the node ND10, a P channel MOS transistor 64*c* connected between the power source node and the node ND10 and having a gate connected to the node ND10, a P channel MOS transistor 64*d* connected between the power source node and the node ND11 and having a gate connected to the node ND11, an N channel MOS transistor 64*e* having one conduction node connected to the node ND10 and a gate connected to the internal data line /IOL, an N channel MOS transistor 64*a* having one conduction node connected to the node ND11 and a gate connected to the internal data line /IOL, an N channel MOS transistor 64*g* connected between the other conduction nodes of the MOS transistors 64*e* and 64*f* and the ground node and having a gate receiving a preamplifier enabling signal PAE, an inverter 64*h* inverting the signal of the node ND10 to generate internal read out data OUT, and an inverter 64*i* inverting the signal of the node ND11 to generate a complementary internal read out data /OUT.

The MOS transistors 64*c* and 64*d* are pull up transistors, and have the channel resistances made sufficiently large. These MOS transistors 64*c* and 64*d* are provided so as to weaken the latch capability on the nodes ND10 and ND11.

The internal data lines IOL and /IOL form the internal data line pair IO shown in FIG. 12.

When the preamplifier enabling signal PAE is at the L level, the MOS transistor 64*g* is in the OFF state and the nodes ND10 and ND11 are maintained at the power source voltage VCC level (VCC−Vthp) by means of the MOS transistors 64*c* and 64*d*. The internal read out data OUT and /OUT from the inverters 64*h* and 64*i* are both at the L level in this state.

When the preamplifier enabling signal PAE is at the H level, the MOS transistor 64*g* is in the ON state and the MOS transistors 64*e* and 64*f* perform the differential amplifying operation in accordance with the signals of the internal data lines IOL and /IOL. When the signal potential of the internal data line IOL is higher than the signal potential of the internal data line /IOL, a larger amount of current flows via the MOS transistor 64*e* so that the voltage level of the node ND10 is lowered. Accordingly, the conductance of the MOS transistor 64*b* becomes larger and the node ND11 is charged, and the voltage level thereof rises from the precharged level to the power source voltage level. Accordingly, the MOS transistor 64*a* enters the OFF state and the node ND10 is discharged via the MOS transistors 64*e* and 64*g* and the voltage level thereof is lowered. MOS transistors 64*c* and 64*d* are mere pull up transistors and do not adverse an effect on the amplifying operation of the MOS transistors 64*a* and 64*b*. The node ND10 attains the L level, while the node ND11 attains the H level and accordingly, the internal read out data OUT and /OUT attain the L level and the H level, respectively.

Accordingly, when differential data are transmitted to the internal data lines IOL and /IOL, the internal read out data can be precisely produced. If the bit line voltage rises due to a minute leak current and the voltage levels of the internal data lines IOL and /IOL change, the internal read out data OUT and /OUT can be precisely generated.

If no minute leak current paths exist and the bit lines BL and /BL are both maintained at the ground voltage level, the internal data lines IOL and /IOL both attain the L level, substantially at the same voltage level. In this case, the nodes ND10 and ND11 attain the intermediate voltage level and accordingly, are pulled up to the H level by the pull up transistors 64*c* and 64*d*. Therefore, in this case, the internal read out data OUT and /OUT both attain the L level. When these internal read out data OUT and /OUT are both at the H level, the existence or nonexistence of a minute leak current can be easily detected in the outside measuring device due to the output circuit set to the output high impedance state. Specifically, when the H level data is read out, a minute leak current path exists, and when the output circuit enters output high impedance state, no leak current paths exist.

Here, in place of the configuration of the preamplifier shown in this FIG. 19, a configuration may be used wherein the voltage levels of the internal data lines IOL and /IOL of the individual internal data line pairs IO are detected and whether or not a minute leak current path exists is determined in accordance with the coincidence/non-coincidence of the logic levels of these voltage levels of the individual internal data pairs IO. "Modification of Driver of Sense Amplifier"

Figure 20:
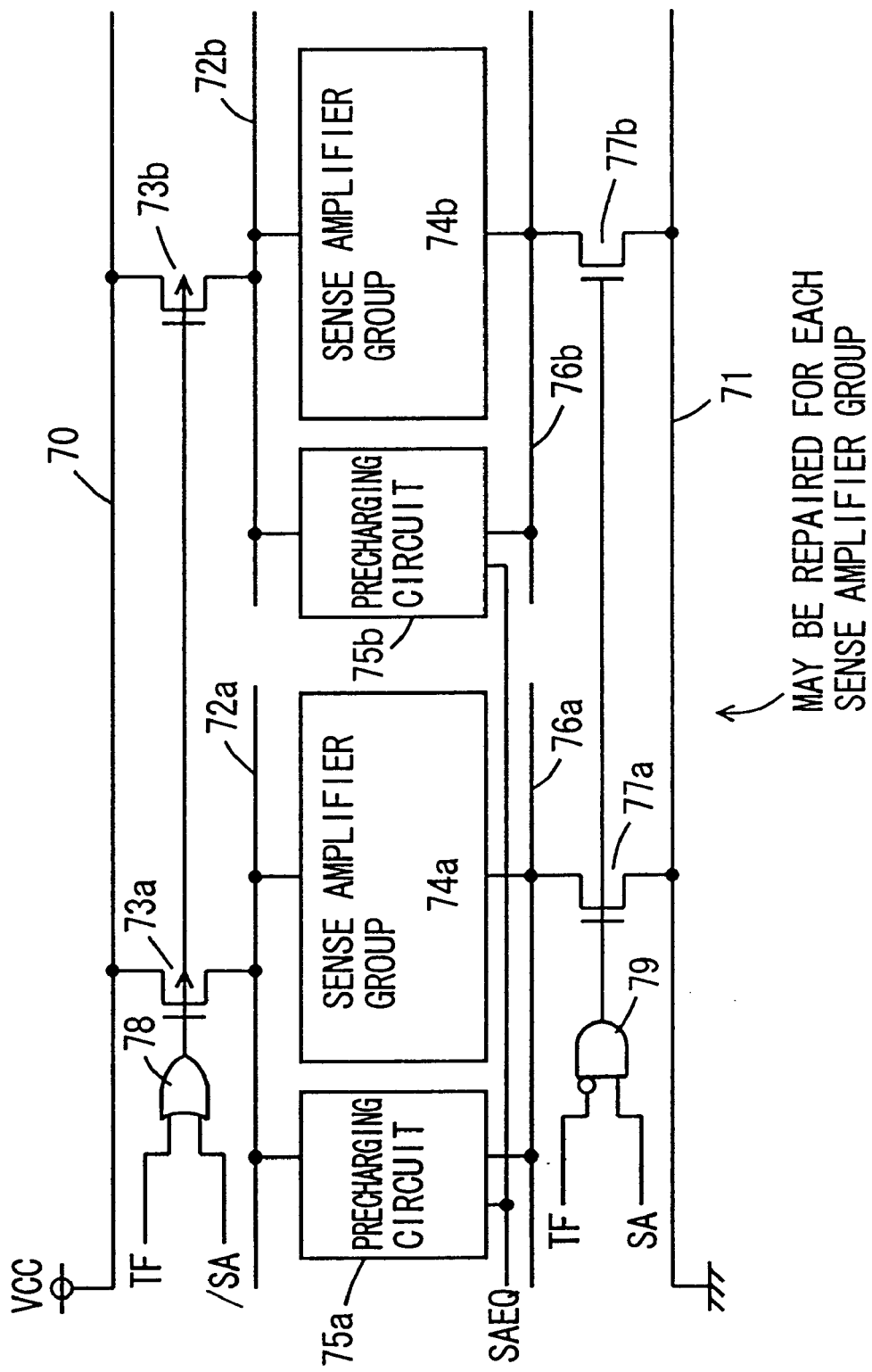
FIG. 20 is a diagram schematically showing the configuration of a modification of the fourth embodiment of the present invention.

FIG. 20 is a diagram schematically showing the configuration of a main part of a modification of the fourth embodiment of the present invention. In FIG. 20, the sense amplifiers 2 are grouped into the sense amplifier groups 94*a* and 94*b*. These sense amplifier groups 94*a* and 94*b* are provided with the local sense amplifier driving signal lines 92*a* and 92*b* as well as the local sense amplifier driving lines 96*a* and 96*b*. The sense amplifier driving signal lines 92*a* and 92*b* are isolated from each other and the local sense amplifier driving signal lines 96*a* and 96*b* are also isolated similarly. The respective source nodes (the connection nodes of the MOS transistors P1 and P2 and the connection nodes of the MOS transistors N1 and N2) of the sense amplifiers (2) included in these sense amplifier groups 94*a* and 94*b* are coupled to the local sense amplifier driving signal lines 92*a*, 92*b* and 96*a*, 96*b*, respectively.

Corresponding to the sense amplifier groups 94a and 94b, respectively, precharging circuits 95a and 95b are provided which are rendered conductive in response to the sense amplifier precharging/equalizing instruction signal SAEQ. The precharging circuits 95a and 95b precharge and equalize these local sense amplifier driving signal lines 92a, 96a and 92b, 96b to the intermediate voltage VBL level when activated.

The local sense amplifier driving signal lines 92a and 92b are coupled to the sense power source line 90 via the sense amplifier activation transistors 93a and 93b, respectively, and the local sense driving signal lines 96a and 96b are also coupled to the sense ground line 91 via the sense amplifier activation transistors 97a and 97b, respectively.

The sense amplifier activation transistors 93a and 93b are P channel MOS transistors to receive, on their respective gates, the output signal of the OR circuit 98, which in turn receives the test mode instruction signal TF and the sense amplifier activation signal /SA. The sense amplifier activation transistors 97a and 97b are formed of N channel MOS transistors to receive, on their respective gates, the output signal of the gate circuit 99, which in turn receives the test mode instruction signal TF and the sense amplifier activation signal SA. This gate circuit 99 outputs a signal of the H level when the test mode instruction signal TF is at the L level and the sense amplifier activation signal SA is at the H level.

When the test mode instruction signal TF is at the L level, the OR circuit 98 and the gate circuit 99 output a signal in accordance with the sense amplifier activation signals /SA and SA. Accordingly, the sense amplifier activation transistors 93a and 93b, 97a and 97b become selectively conductive, respectively. Therefore, when a sensing operation is performed, the sense amplifier driving signal lines 92a, 92b are connected to the sense power source line 90 and the sense amplifier driving signal lines 96a and 96b are connected to the sense ground line 91.

In the standby state, these sense amplifier activation transistors 93a, 93b, 97a and 97b are in the OFF state and the local sense amplifier driving signal lines 92a and 92b are isolated from the sense power source line 90 and the local sense amplifier driving signal lines 96a and 96b are also isolated from the sense ground line. In this state, the local sense amplifier driving signal lines 92a, 92b, 96a and 96b are precharged to the intermediate voltage VBL level by means of the precharging circuits 95a and 95b.

When the test mode instruction signal TF is at the H level, the output signal of the OR circuit 98 attains the H level and the output signal of the gate circuit 99 attains the L level. Thus, the sense amplifier activation transistors 93a, 93b, 97a and 97b all maintain the OFF state and the local sense amplifier driving signal lines 92a, 92b, 96a and 96b are isolated from the sense power source line 90 and sense ground line 91.

Accordingly, in the test mode, even if the local sense amplifier driving signal lines 92a, 92b, 96a and 96b are driven to the ground voltage level by means of the precharging circuits 95a and 95b, the sense power source line 90 and the sense ground line 91 undergo no effects. Under this state, even if the voltage level of the common bit line CBL0, for example, rises in FIG. 7 and a leak current flows via the MOS transistor P1 of the sense amplifier 2, the local sense amplifier driving signal line is merely charged. Therefore, the bit line potential can be raised reliably without any affect from the local sense amplifier driving signal lines. In this case, by delaying the column selection operation starting timing, the voltage level of the bit line BL0 and the common bit line CBL0, as well as the local sense amplifier driving signal line, can be raised reliably even by means of a minute leak current.

As described above, according to the fourth embodiment of the present invention, all of the word lines are driven to the selected state after the bit line is once fixed at the ground voltage level. Thus, the bit line voltage can be raised reliably, even with a minute leak current due to a micro short circuit. Consequently, the detection of a minute leak current can be performed reliably through detection by a preamplifier circuit.

Fifth Embodiment

FIG. 21 is a diagram schematically showing the configuration of a semiconductor memory device according to the fifth embodiment of the present invention. In the configuration shown in this FIG. 21, the bit line precharging/equalizing circuit groups 92l and 92r are arranged in the memory array blocks 90l and 90r, respectively. These bit line precharging/equalizing circuit groups 92l and 92r each include bit line precharging/equalizing circuits provided corresponding to the respective bit line pairs of the corresponding memory array blocks 90l and 90r. The configuration of these bit line precharging/equalizing circuits is, for example, the same as the configuration of the bit line precharging/equalizing circuit 1 shown in FIG. 1.

The bit line precharging/equalizing circuit 92l is coupled to the sense amplifier circuit group 96 via the bit line isolation gate group 94l, which in turn becomes selectively conductive in response to the bit line isolation instruction signal BIL1. The bit line precharging/equalizing circuit 92r is coupled to the sense amplifier circuit group 96 via the bit line isolation gate group 92r, which in turn selectively become conductive in response to the bit line isolation instruction signal BILr. Accordingly, in the configuration of the shared sense amplifier shown in this FIG. 2 1, the sense amplifier circuits are shared between the memory array blocks 90l and 90r, while the bit line precharging/equalizing circuits are not shared in between.

The bit line precharging/equalizing circuit group 92l transmits the bit line precharging voltage VBL to the corresponding bit line pairs of the memory array block in response to the bit line equalizing instruction signal BLEQl, while the bit line precharging/equalizing circuit 92r transmits the bit line precharging voltage VBL of the intermediate voltage level to the bit lines of the memory array block in response to the bit line precharging/equalizing instruction signal BLEQr.

Current control mechanisms 98l and 98r are arranged for the bit line precharging voltage transmission lines. These current control mechanisms 98l and 98r can have any of the configurations of the previous first to fourth embodiments as far as it can detect a flow of a minute current in the memory array blocks 98l and 98r. Here, in FIG. 21, current control mechanisms are arranged correspondingly to the respective memory array blocks 98l and 98r, and the bit line voltage transmission line 5 is arranged in common for all of the memory array blocks, as shown in the first and seconds embodiments. Therefore, in this case, the current control mechanism is arranged in common for the memory array blocks 98l and 98r. Here, in order to show that the detection of a minute current is possible with the memory array blocks being units, current control mechanisms are arranged individually in the memory array blocks 98l and 98r.

The bit line isolation instruction signals BIL1 and BILr are at the L level when non-selected, to isolate the sense amplifier circuit group 96 from the memory array blocks 98l and 98r. Only the memory array block which includes selected memory cells is coupled to the sense amplifier circuit group 96 via the associated bit line isolation gate group.

In addition, the bit line precharging/equalizing instruction signal BLEQ is in the active state in the non-selected memory array block and the bit line is precharged and equalized to the intermediate voltage VBL level if a corresponding fuse element is not blown off.

When one of the memory array blocks 90r and 90l is selected, the sense amplifier circuit group 96 is coupled to the selected memory array block via the corresponding bit line isolation gate group, and is activated in accordance with the sense amplifier driving signals SP and SN, to sense and amplify the memory cell data of the selected memory array block.

In this circuit configuration, in the standby state or in the non-selected state, the path through which a current flows from the power source node of the sense amplifier circuit to the fixed defective bit line is blocked by the bit line isolation gate. Therefore, the defective bit line can be isolated reliably from the current supply source by blowing off the fuse element. Thus, a semiconductor memory device of an extremely low current consumption can be implemented. In addition, in the testing, since the bit line is isolated from the sense power source in the standby state or in the non-selected state, a leak current from the bit precharging voltage transmission line can be precisely detected, and a semiconductor memory device with a high reliability can be implemented.

Other Embodiments

In these first to fourth embodiments, the memory cell columns are divided into two groups and link elements 4a and 4b are arranged correspondingly for each group. However, the number of division into the groups of the memory cells may be greater. In addition, this holds for the configuration shown in FIG. 20 and the sense amplifier groups may be divided into a greater number of groups than two. In this case, the effects of the local sense amplifier driving signal line on the voltage rise of the bit line can be made smaller.

In the above described first to fourth embodiments, the bit line precharging/equalizing circuit is isolated from the main intermediate voltage transmission line. As shown in FIG. 20, however, in the arrangement that the sense amplifiers are divided into a plurality of groups, a configuration may be used where a precharge circuit is provided for each sense amplifier group and each sense amplifier group is also isolated from the corresponding intermediate voltage transmission line, similarly to the bit line precharging/equalizing circuits.

In addition, in the above description, a DRAM is described. However, in the case that the effect of a leak current, caused by a short circuit between a bit line and a word line, is large in the circuit where bit lines are precharged in the standby state, such as in a static random access memory, each bit line load circuit (bit line precharging circuit) may be isolated from the precharging voltage transmission line with the groups being units similarly. Further, the detection of a minute leak current can be performed by limiting the supplying current of the bit line load circuit in the same manner.

Moreover, in a DRAM, the same effects can be achieved even if two word lines are selected at the same time and complementary data of the memory cell are read out at the same time on the corresponding bit lines BL and /BL. Specifically, if a micro short circuit exists on a bit line onto which the H level data is read out, the voltage level of the H level data is lowered below the bit line potential onto which the L level data is read out. Therefore, a bit line defect can be detected by means of the function test, in the arrangement that the bit line precharging current is controlled and in the arrangement that the word line selection timing is delayed.

As described above, according to the present invention, even if a minute leak current exists, the voltage level of the bit line is configured to change, and therefore a bit line defect, such as a micro short circuit, can be precisely detected. In addition, the precharging circuit corresponding to a part where this bit line defect has occurred, is configured to be isolated from the precharging current supply source, so that a semiconductor memory device of an extremely low standby current can be produced with a good yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in rows and columns;
   a plurality of column lines, arranged correspondingly to the respective columns, each connected to memory cells on a corresponding column;
   a plurality of column line potential maintaining circuits provided corresponding to said plurality of column lines, for maintaining corresponding column lines at a predetermined potential when activated;
   a voltage transmission line for supplying said predetermined voltage to the column line potential maintaining circuits;
   a current control circuit for causing a current to flow between said voltage transmission line and the column line potential maintaining circuits, with the current restricted in magnitude; and
   isolation circuits provided for each predetermined number of the column line potential maintaining circuits, for isolating corresponding column line potential maintaining circuits from said voltage transmission line.

2. The semiconductor memory device according to claim 1, wherein said current control circuit includes:
   a transistor element arranged between said voltage transmission line and a predetermined number of the column line potential maintaining circuits; and
   a constant current circuit forming a current mirror circuit with said transistor element, for causing a mirror current of a constant current to flow through said transistor element.

3. The semiconductor memory device according to claim 2, wherein said constant current circuit includes:
   a constant current source, formed on a common semiconductor chip with the memory cells, for supplying said constant current; and
   a constant current transistor, coupled to said constant current source, for forming the current mirror circuit with said transistor element.

4. The semiconductor memory device according to claim 3, wherein said constant current source is a variable constant current source to supply a variable current as said constant current.

5. The semiconductor memory device according to claim 4, further including a circuit for setting a supply current of said constant current source in accordance with an externally applied signal.

6. The semiconductor memory device according to claim 4, further comprising a register circuit for storing data setting an amount of a current supplied by said constant current source.

7. The semiconductor memory device according to claim 2, wherein said constant current circuit comprises a node coupled to an externally provided constant current source in a test mode, and a constant current transistor, connected to said node, for forming said current mirror circuit with said transistor element.

8. The semiconductor memory device according to claim 7, wherein said constant current transistor has a mirror ratio variable.

9. The semiconductor memory device according to claim 7, further including a circuit for setting an amount of a current supplied by said constant current transistor in accordance with an externally applied signal.

10. The semiconductor memory device according to claim 7, further comprising a register circuit for setting an amount of a current supplied by said constant current transistor.

11. A semiconductor memory device comprising:
a plurality of memory cells arranged in rows and columns;
a plurality of row lines, arranged correspondingly to the respective rows of the memory cells, each connected to the memory cells on a corresponding row;
a plurality of column lines, arranged correspondingly to the respective columns of the memory cells, each connected to the memory cells on a corresponding column;
column line potential maintaining circuits arranged correspondingly to said plurality of column lines, for holding corresponding column lines at a predetermined potential level when activated;
a column line potential setting circuit for setting a holding potential of said column line potential maintaining circuits at a first potential level different from said predetermined potential in a test mode;
a row line potential setting circuit for setting a predetermined number of row lines at a second potential different from said first potential in the test mode; and
a circuit for reading out data of a selected memory cell of said plurality of memory cells.

12. The semiconductor memory device according to claim 11, wherein
said plurality of memory cells are divided into a plurality of groups;
said column line potential setting circuit sets the potential of said column lines at said first potential with said groups being units; and
said row line potential setting circuit supplies the second potential to drive all the row lines into the selected state for each group in said test mode.

* * * * *